US012764948B2

(12) United States Patent
Hayashi

(10) Patent No.: US 12,764,948 B2
(45) Date of Patent: Oct. 13, 2026

(54) SEMICONDUCTOR DEVICE AND METHOD OF MANUFACTURING THE SAME

(71) Applicant: Kioxia Corporation, Tokyo (JP)

(72) Inventor: Hidekazu Hayashi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 705 days.

(21) Appl. No.: 17/931,569

(22) Filed: Sep. 13, 2022

(65) Prior Publication Data

US 2023/0301080 A1 Sep. 21, 2023

(30) Foreign Application Priority Data

Mar. 15, 2022 (JP) ................................. 2022-040674

(51) Int. Cl.

*H10B 43/40* (2023.01)
*H10B 41/27* (2023.01)
*H10B 43/27* (2023.01)

(52) U.S. Cl.

CPC ............. *H10B 41/27* (2023.02); *H10B 43/27* (2023.02)

(58) Field of Classification Search

None

See application file for complete search history.

(56) References Cited

U.S. PATENT DOCUMENTS 5,458,755 A 10/1995 Fujiyama et al.
5,854,123 A 12/1998 Sato et al.
6,199,563 B1 3/2001 Uehara et al.
6,337,030 B1 1/2002 Sakaguchi
6,342,433 B1 1/2002 Ohmi et al.
6,376,332 B1 4/2002 Yanagita et al.
6,417,069 B1 7/2002 Sakaguchi et al.
6,418,999 B1 7/2002 Yanagita et al.
6,427,748 B1 8/2002 Yanagita et al.

(Continued)

FOREIGN PATENT DOCUMENTS

CN 113972144 A 1/2022
CN 114078759 A 2/2022

(Continued)

OTHER PUBLICATIONS

Takao Yonehara, et al., "ELTRAN®; Novel SOI Wafer Technology", Cutting Edge 2, JSAP International No. 4, Jul. 2001, 7 pages.

(Continued)

*Primary Examiner* — Sarah K Salerno
(74) *Attorney, Agent, or Firm* — Oblon, McClelland, Maier & Neustadt, L.L.P.

(57) ABSTRACT

In one embodiment, a method of manufacturing a semiconductor device includes forming a first film on a first substrate, forming a porous layer in a first portion of the first film and a non-porous layer in a second portion of the first film, forming a second film including a first device on the first film, forming a third film including a second device on a second substrate, and bonding the second film on the first substrate and the third film on the second substrate to be opposite to each other. Furthermore, the semiconductor device includes a first region and a second region. Moreover, the first device and the second device are located in the first region, the first portion is located among the first region and the second region, and the second portion is located in the second region.

20 Claims, 22 Drawing Sheets

(56) References Cited

U.S. PATENT DOCUMENTS

| | | | |
|---|---|---|---|
| 6,436,226 B1 | 8/2002 | Omi et al. | |
| 6,452,091 B1 | 9/2002 | Nakagawa et al. | |
| 6,527,031 B1 | 3/2003 | Yanagita et al. | |
| 6,540,861 B2 | 4/2003 | Sakaguchi et al. | |
| 6,609,446 B1 | 8/2003 | Ohmi et al. | |
| 6,629,539 B1 | 10/2003 | Yanagita et al. | |
| 6,653,205 B2 | 11/2003 | Yanagita et al. | |
| 6,653,206 B2 | 11/2003 | Yanagita et al. | |
| 6,672,358 B2 | 1/2004 | Yanagita et al. | |
| 6,712,288 B2 | 3/2004 | Yanagita et al. | |
| 6,825,099 B2 | 11/2004 | Yanagita et al. | |
| 6,833,312 B2 | 12/2004 | Yanagita et al. | |
| 6,852,187 B2 | 2/2005 | Yanagita et al. | |
| 6,867,110 B2 | 3/2005 | Yanagita et al. | |
| 11,444,061 B2 | 9/2022 | Okubo et al. | |
| 2002/0045327 A1 | 4/2002 | Yanagita et al. | |
| 2003/0205480 A1 | 11/2003 | Sakaguchi et al. | |
| 2004/0060574 A1 | 4/2004 | Watanabe et al. | |
| 2004/0124088 A1 | 7/2004 | Tsuboi et al. | |
| 2004/0152319 A1 | 8/2004 | Yamagata et al. | |
| 2004/0169011 A1 | 9/2004 | Takanashi et al. | |
| 2018/0277632 A1* | 9/2018 | Fanelli | H01L 21/30604 |
| 2018/0350785 A1* | 12/2018 | Fong | H01L 24/94 |
| 2022/0059408 A1* | 2/2022 | Hayashi | H10B 43/40 |

FOREIGN PATENT DOCUMENTS

| | | | |
|---|---|---|---|
| EP | 0 989 593 | A2 | 3/2000 |
| JP | 5-198556 | A | 8/1993 |
| JP | 5-198557 | A | 8/1993 |
| JP | 6-151406 | A | 5/1994 |
| JP | 10-223585 | A | 8/1998 |
| JP | 10-229066 | A | 8/1998 |
| JP | 10-242102 | A | 9/1998 |
| JP | 10-242103 | A | 9/1998 |
| JP | 11-195563 | A | 7/1999 |
| JP | 11-195568 | A | 7/1999 |
| JP | 11-195569 | A | 7/1999 |
| JP | 11-195570 | A | 7/1999 |
| JP | 11-243040 | A | 9/1999 |
| JP | 11-243076 | A | 9/1999 |
| JP | 11-288859 | A | 10/1999 |
| JP | 11-288860 | A | 10/1999 |
| JP | 11-317509 | A | 11/1999 |
| JP | 2000-49061 | A | 2/2000 |
| JP | 2000-49062 | A | 2/2000 |
| JP | 2000-68172 | A | 3/2000 |
| JP | 2000-68173 | A | 3/2000 |
| JP | 2000-77286 | A | 3/2000 |
| JP | 2000-91304 | A | 3/2000 |
| JP | 2000-100677 | A | 4/2000 |
| JP | 2000-100678 | A | 4/2000 |
| JP | 2000-133632 | A | 5/2000 |
| JP | 2000-150456 | A | 5/2000 |
| JP | 2000-150495 | A | 5/2000 |
| JP | 2000-150611 | A | 5/2000 |
| JP | 2000-150836 | A | 5/2000 |
| JP | 2000-150837 | A | 5/2000 |
| JP | 2000-188269 | A | 7/2000 |
| JP | 2000-223383 | A | 8/2000 |
| JP | 2000-223683 | A | 8/2000 |
| JP | 3110178 | B2 | 11/2000 |
| JP | 2000-336499 | A | 12/2000 |
| JP | 2001-23948 | A | 1/2001 |
| JP | 2001-26500 | A | 1/2001 |
| JP | 3149060 | B2 | 3/2001 |
| JP | 2001-94081 | A | 4/2001 |
| JP | 2001-230393 | A | 8/2001 |
| JP | 2002-50749 | A | 2/2002 |
| JP | 2002-75915 | A | 3/2002 |
| JP | 2002-75916 | A | 3/2002 |
| JP | 2002-75917 | A | 3/2002 |
| JP | 2002-353081 | A | 12/2002 |
| JP | 2002-353423 | A | 12/2002 |
| JP | 2003-17667 | A | 1/2003 |
| JP | 2003-17668 | A | 1/2003 |
| JP | 2003-17669 | A | 1/2003 |
| JP | 2004-99965 | A | 4/2004 |
| JP | 2004-103800 | A | 4/2004 |
| JP | 2004-107701 | A | 4/2004 |
| JP | 2004-111491 | A | 4/2004 |
| JP | 2004-111492 | A | 4/2004 |
| JP | 2004-158882 | A | 6/2004 |
| JP | 2004-207503 | A | 7/2004 |
| JP | 2004-211111 | A | 7/2004 |
| JP | 2004-214237 | A | 7/2004 |
| JP | 2004-214238 | A | 7/2004 |
| JP | 2004-228150 | A | 8/2004 |
| JP | 2004-241754 | A | 8/2004 |
| JP | 3831877 | B2 | 10/2006 |
| JP | 3831878 | B2 | 10/2006 |
| JP | 4143161 | B2 | 9/2008 |
| JP | 4143162 | B2 | 9/2008 |
| JP | 4272796 | B2 | 6/2009 |
| JP | 4323577 | B2 | 9/2009 |
| JP | 4365907 | B2 | 11/2009 |
| JP | 4365920 | B2 | 11/2009 |
| JP | 4770706 | B2 | 9/2011 |
| JP | 2023-44430 | A | 3/2023 |
| TW | 330307 | B | 4/1998 |

OTHER PUBLICATIONS

SOI-Epi Wafer® ELTRAN®, www.canon.co.jp/eltran, 2000, 6 pages (with English Translation).

"SOI-Epi wafers with excellent uniformity formed by bond and new selective etching of porous Si", ELTRAN® (Epitaxial Layer TRANsfer) New SOI (Si on Insulator Wafer, www.canon.co.jp/eltran, 4 pages(with English Translation).

K. Ohmi,et al., 'Water Jet Splitting of Thin Porous Si for ELTRAN®', Extended Abstracts of the 1999 International Conference on Solid State Devices and Materials, 1999, pp. 354-355.

* cited by examiner

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2022-040674, filed on Mar. 15, 2022, the entire contents of which are incorporated herein by reference.

FIELD

Embodiments described herein relate to a semiconductor device and a method of manufacturing the same.

BACKGROUND

In a case of bonding a substrate to another substrate to manufacture a semiconductor device, these substrates may need to be separated after bonding. In this case, it is desirable to employ a method of enabling these substrates to be suitably separated.

DETAILED DESCRIPTION

Figure 1:
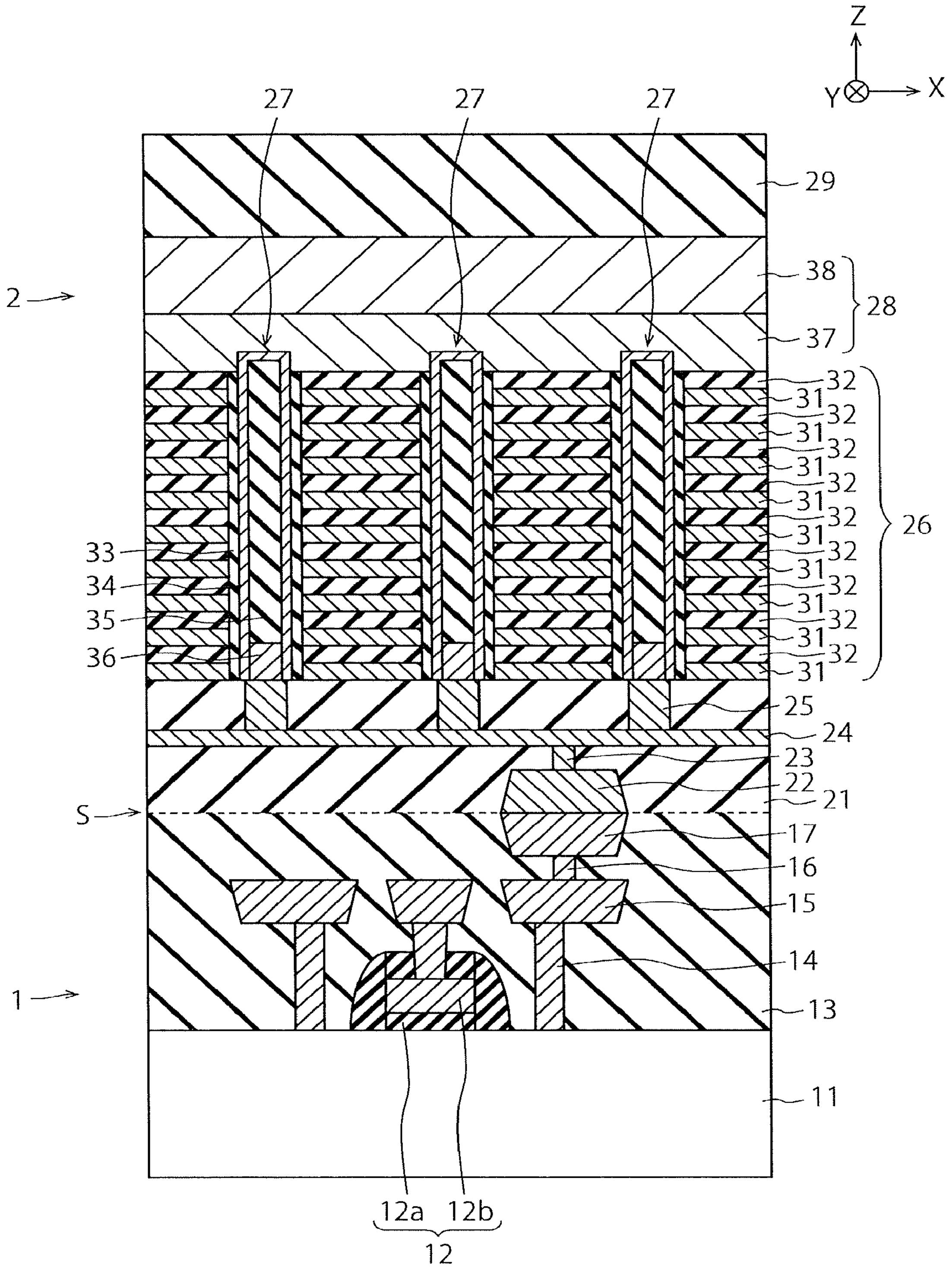
FIG. 1 is a cross-sectional view showing a structure of a semiconductor device of a first embodiment.

Embodiments will now be explained with reference to the accompanying drawings. In FIGS. 1 to 22B, the same component is denoted by the same reference character, and redundant explanation will be omitted.

In one embodiment, a method of manufacturing a semiconductor device includes forming a first film on a first substrate, forming a porous layer in a first portion of the first film and a non-porous layer in a second portion of the first film, forming a second film including a first device on the first film, forming a third film including a second device on a second substrate, and bonding the second film on the first substrate and the third film on the second substrate to be opposite to each other. Furthermore, the semiconductor device includes a first region and a second region. Moreover, the first device and the second device are located in the first region, the first portion is located among the first region and the second region, and the second portion is located in the second region.

First Embodiment

FIG. 1 is a cross-sectional view showing a structure of a semiconductor device of a first embodiment. The semiconductor device of FIG. 1 is a three-dimensional flash memory, for example.

The semiconductor device of FIG. 1 includes a circuit region 1 including a CMOS (Complementary Metal Oxide Semiconductor) circuit, and an array region 2 including a memory cell array. The memory cell array includes a plurality of memory cells that store data, and the CMOS circuit includes a peripheral circuit that controls an operation of the memory cell array. The memory cell array is an example of a second device, and the CMOS circuit is an example of a first device. The semiconductor device of FIG. 1 is manufactured by, for example, bonding a circuit wafer including the circuit region 1 and an array wafer including the array region 2, as will be described later. The reference character S indicates a bonding face between the circuit region 1 and the array region 2.

FIG. 1 shows an X direction, a Y direction, and a Z direction perpendicular to one another. In this description, the +Z direction is treated as an upward direction, and the −Z direction as a downward direction. For example, the circuit region 1 is depicted in the −Z direction relative to the array region 2, and is therefore located under the array region 2. The −Z direction may or may not agree with the direction of gravitational force.

In FIG. 1, the circuit region 1 includes a substrate 11, a transistor 12, an inter layer dielectric 13, a plurality of contact plugs 14, an interconnect layer 15 including a plurality of interconnects, a via plug 16, and a metal pad 17. FIG. 1 shows three of the plurality of interconnects in the interconnect layer 15 and three of the contact plugs 14 provided under these interconnects. The substrate 11 is an example of a second substrate. The inter layer dielectric 13 is an example of a third film. The metal pad 17 is an example of a second pad.

In FIG. 1, the array region 2 includes an inter layer dielectric 21, a metal pad 22, a via plug 23, an interconnect layer 24 including a plurality of interconnects, a plurality of contact plugs 25, a stacked film 26, a plurality of pillar portions 27, a source layer 28, and an insulator 29. FIG. 1 shows one of the plurality of interconnects in the interconnect layer 24, and three of the contact plugs 25 and three of the pillar portions 27 provided on this interconnect. The metal pad 22 is an example of a first pad. The stacked film 26 is an example of a second film.

Moreover, the stacked film 26 includes a plurality of electrode layers 31 and a plurality of insulating layers 32 as shown in FIG. 1. Each of the pillar portions 27 includes a memory insulator 33, a channel semiconductor layer 34, a core insulator 35, and a core semiconductor layer 36. The source layer 28 includes a semiconductor layer 37 and a metal layer 38.

Hereinafter, the structure of the semiconductor device of the present embodiment will be described with reference to FIG. 1.

The substrate 11 is a semiconductor substrate such as a Si (silicon) substrate, for example. The transistor 12 includes a gate insulator 12*a* and a gate electrode 12*b* sequentially formed on the substrate 11, and a source diffusion layer and a drain diffusion layer neither shown but formed in the substrate 11. The transistor 12 constitutes the above-described CMOS circuit, for example. The inter layer dielectric 13 is formed on the substrate 11 so as to cover the transistor 12. The inter layer dielectric 13 is a $SiO_2$ film (silicon oxide film), or a stacked film including a $SiO_2$ film and another insulator, for example.

The contact plugs 14, the interconnect layer 15, the via plug 16, and the metal pad 17 are formed in the inter layer dielectric 13. To be specific, the contact plugs 14 are arranged on the substrate 11 or the gate electrode 12*b* of the transistor 12. In FIG. 1, the contact plugs 14 on the substrate 11 are provided on the source diffusion layer and the drain diffusion layer of the transistor 12, neither shown. The interconnect layer 15 is arranged on the contact plugs 14, and the via plug 16 is arranged on the interconnect layer 15. The metal pad 17 is arranged on the via plug 16 above the substrate 11. The metal pad 17 is a metal layer including a Cu (copper) layer, for example.

The inter layer dielectric 21 is formed on the inter layer dielectric 13. The inter layer dielectric 21 is a $SiO_2$ film, or a stacked film including a $SiO_2$ film and another insulator, for example.

The metal pad 22, the via plug 23, the interconnect layer 24, and the contact plugs 25 are formed in the inter layer dielectric 21. To be specific, the metal pad 22 is arranged on the metal pad 17 above the substrate 11. The metal pad 22 is a metal layer including a Cu layer, for example. The via plug 23 is arranged on the metal pad 22, and the interconnect layer 24 is arranged on the via plug 23. FIG. 1 shows one of the plurality of interconnects in the interconnect layer 24, and this interconnect functions as a bit line, for example. The contact plugs 25 is arranged on the interconnect layer 24.

The stacked film 26 is provided on the inter layer dielectric 21, and includes the plurality of electrode layers 31 and the plurality of insulating layers 32 stacked alternately in the Z direction. The electrode layers 31 are metal layers each including a W (tungsten) layer, for example, and function as word lines. The insulating layers 32 are $SiO_2$ films, for example.

Each of the pillar portions 27 is provided in the stacked film 26, and includes the memory insulator 33, the channel semiconductor layer 34, the core insulator 35, and the core semiconductor layer 36. The memory insulator 33 is formed on a side face of the stacked film 26, and has a tubular shape extending in the Z direction. The channel semiconductor layer 34 is formed on a side face of the memory insulator 33, and has a tubular shape extending in the Z direction. The core insulator 35 and the core semiconductor layer 36 are formed on a side face of the channel semiconductor layer 34, and each have a rod shape extending in the Z direction. To be specific, the core semiconductor layer 36 is arranged on the contact plugs 25, and the core insulator 35 is arranged on the core semiconductor layer 36.

The memory insulator 33 sequentially includes a block insulator, a charge storing layer, and a tunnel insulator, for example, as will be described later. The block insulator is a $SiO_2$ film, for example. The charge storing layer is a SiN film (silicon nitride film), for example. The tunnel insulator is a $SiO_2$ film or a SiON film (silicon oxynitride film), for example. The channel semiconductor layer 34 is a polysilicon layer, for example. The core insulator 35 is a $SiO_2$ film, for example. The core semiconductor layer 36 is a polysilicon layer, for example. Each of the memory cells in the above-described memory cell array is composed of the channel semiconductor layer 34, the charge storing layer, the electrode layers 31, and the like.

The channel semiconductor layer 34 and the core semiconductor layer 36 in each of the pillar portions 27 are electrically connected to the metal pad 22 via the contact plugs 25, the interconnect layer 24, and the via plug 23. Therefore, the memory cell array in the array region 2 is electrically connected to the peripheral circuit in the circuit region 1 via the metal pad 22 and the metal pad 17. This makes it possible to control the operation of the memory cell array by the peripheral circuit.

The source layer 28 includes the semiconductor layer 37 and the metal layer 38 sequentially formed on the stacked film 26 and the pillar portions 27, and functions as a source line. In the present embodiment, the channel semiconductor layer 34 of each of the pillar portions 27 is exposed from the memory insulator 33, and the semiconductor layer 37 is directly formed on the channel semiconductor layer 34. In addition, the metal layer 38 is directly formed on the semiconductor layer 37. This allows the source layer 28 to be electrically connected to the channel semiconductor layer 34 and the core semiconductor layer 36 of each of the pillar portions 27. The semiconductor layer 37 is a polysilicon layer, for example. The metal layer 38 includes a W layer, a Cu layer, or an Al (aluminum) layer, for example.

The insulator 29 is formed on the source layer 28. The insulator 29 is a $SiO_2$ film, for example.

Figure 2:
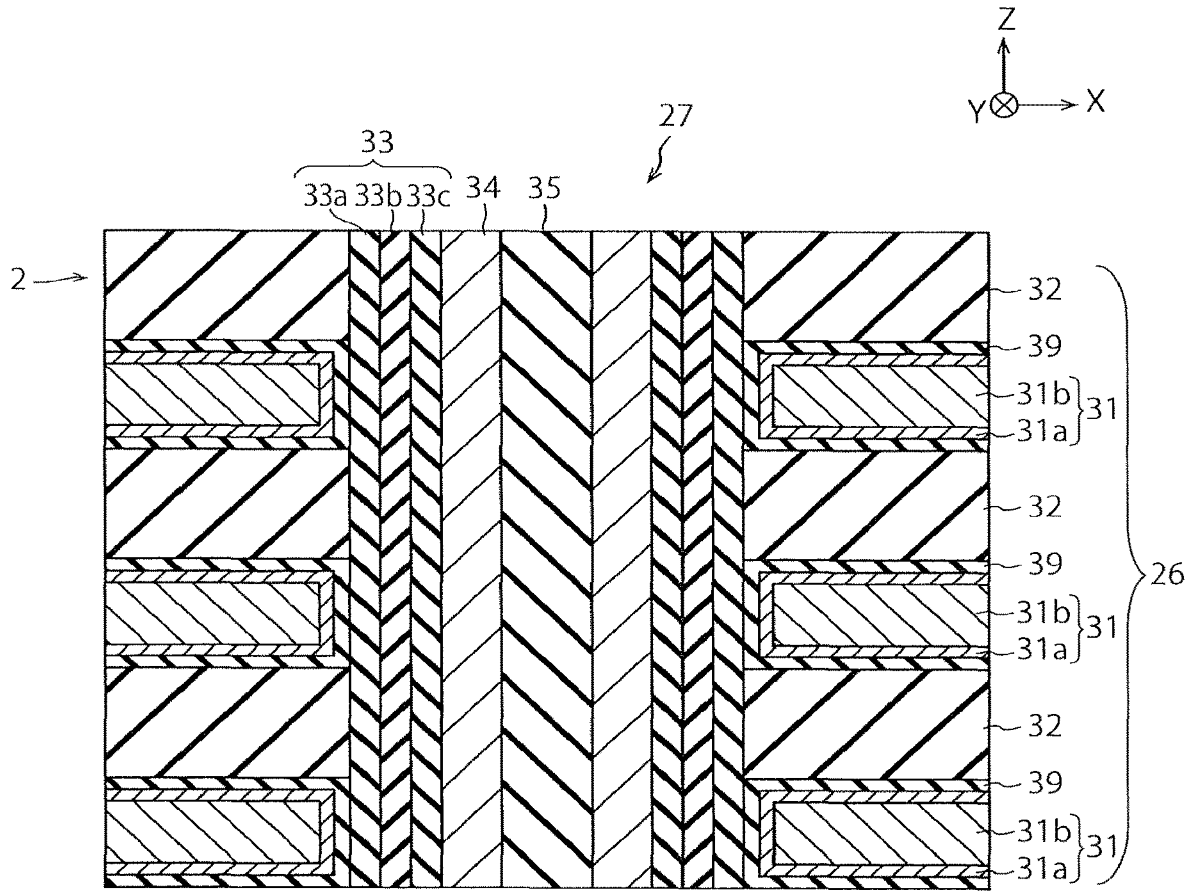
FIG. 2 is a magnified cross-sectional view showing the structure of the semiconductor device of the first embodiment.

FIG. 2 is a magnified cross-sectional view showing the structure of the semiconductor device of the first embodiment.

FIG. 2 shows three of the electrode layers 31 and three of the insulating layers 32 included in the stacked film 26, as well as one of the pillar portions 27 provided in the stacked film 26. The memory insulator 33 in each of the pillar portions 27 includes a block insulator 33*a*, a charge storing layer 33*b*, and a tunnel insulator 33*c* sequentially formed on the side face of the stacked film 26, as described above. The block insulator 33*a* is a $SiO_2$ film, for example. The charge storing layer 33*b* is a SiN film, for example. The tunnel insulator 33*c* is a $SiO_2$ film or a SiON film, for example.

On the other hand, each of the electrode layers 31 includes a barrier metal layer 31*a* and an electrode material layer 31*b*.

The barrier metal layer 31*a* is a TiN film (titanium nitride film), for example. The electrode material layer 31*b* is a W layer, for example. Each of the electrode layers 31 of the present embodiment is formed on a lower face of an overlying one of the insulating layers 32, an upper face of an underlying one of the insulating layers 32, and a side face of the block insulator 33*a* with the interposition of the block insulator 39 as shown in FIG. 2. The block insulator 39 is an $Al_2O_3$ film (aluminum oxide film), for example, and functions as a block insulator of each of the memory cells in conjunction with the block insulator 33*a*.

FIGS. 3A to 4C are cross-sectional views showing a method of manufacturing the semiconductor device of the first embodiment. The semiconductor device of the present embodiment is manufactured by bonding a circuit wafer W1 and an array wafer W2 which will be described later. The circuit wafer W1 is used for manufacturing the circuit region 1, and the array wafer W2 is used for manufacturing the array region 2. The circuit wafer W1 and the array wafer W2 each have a disc-like shape.

Figure 3A:
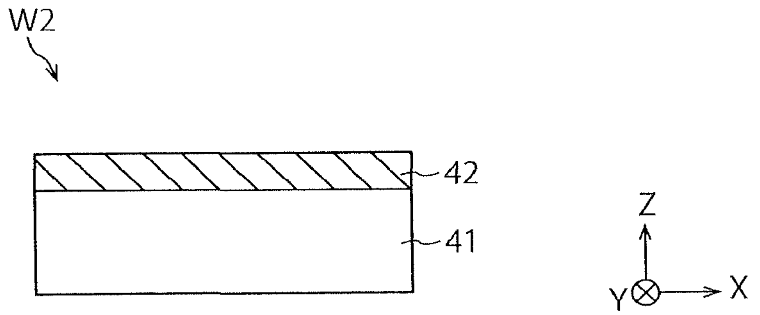
FIGS. 3A to 4C are cross-sectional views showing a method of manufacturing the semiconductor device of the first embodiment.

First, a substrate 41 for the array wafer W2 is prepared (FIG. 3A). The substrate 41 is a semiconductor substrate such as a Si substrate, for example. The substrate 41 is an example of a first substrate.

Next, a semiconductor layer 42 is formed on the substrate 41 (FIG. 3A). The semiconductor layer 42 is an amorphous semiconductor layer such as an amorphous Si layer, for example. The semiconductor layer 42 of the present embodiment includes a high concentration of impurity atoms. The impurity atoms are H (hydrogen) atoms, for example. The concentration of the H atoms in the semiconductor layer 42 of the present embodiment is more than or equal to $1.0\times10^{21}/cm^3$, for example. The impurity atoms may be other than H atoms, and may be rare gas atoms such as He (helium) atoms, for example. The semiconductor layer 42 is an example of a first film.

Figure 3B:
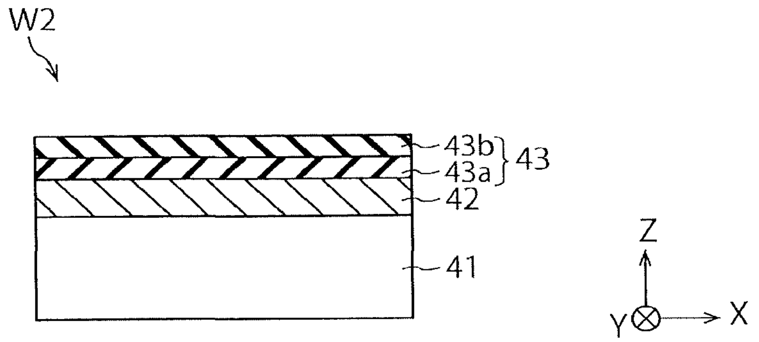

Next, a cap insulator 43 is formed on the semiconductor layer 42 (FIG. 3B). The cap insulator 43 includes an insulator 43*a* formed on the semiconductor layer 42, and an insulator 43*b* formed on the insulator 43*a*. The insulator 43*a* is a $SiO_2$ film, for example. The insulator 43*b* is a SiN film, for example. The cap insulator 43 is also an example of a first film.

Figure 3C:
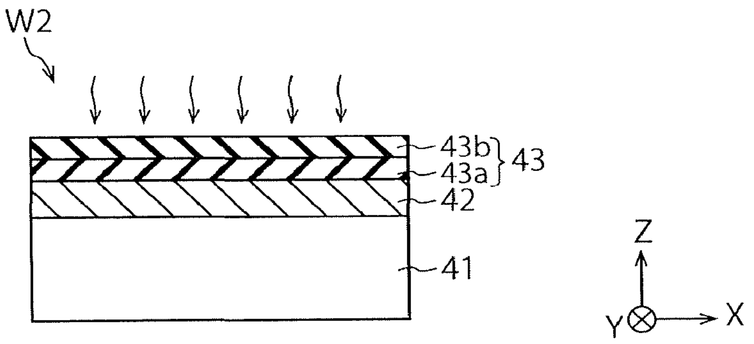
Figure 4A:
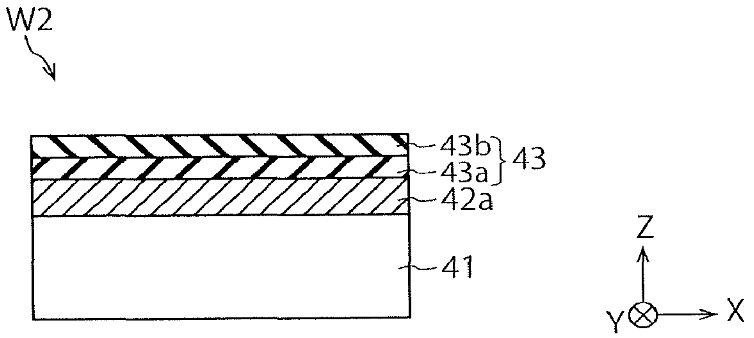

Next, the array wafer W2 is subjected to laser annealing (FIG. 3C). This heats the semiconductor layer 42 to be melted. A melting temperature of the semiconductor layer 42 is 1300° C. or above, for example. Thereafter, the semiconductor layer 42 is crystallized to turn into a semiconductor layer 42*a* (FIG. 4A). The semiconductor layer 42*a* is a porous semiconductor layer such as a porous poly-Si layer, for example. The semiconductor layer 42 of the present embodiment is made porous during crystallization to turn into a porous poly-Si layer which is a poly-Si layer and a porous layer. This porous layer has a porosity of more than or equal to 40% for example, and desirably has a porosity of more than or equal to 50%.

Laser annealing of the present embodiment is conducted using UV light (ultraviolet light), for example. This enables the semiconductor layer 42 to turn into the semiconductor layer 42*a*. The intensity of UV light is set at 0.3 to 2.0 $J/cm^2$, for example. Laser annealing of the present embodiment may be conducted using laser light other than UV light, and may be conducted using light having a wavelength less than or equal to the wavelength of visible light, for example.

The semiconductor layer 42 is made porous in the present embodiment when impurity atoms in the semiconductor layer 42 gather and form a large number of voids (pores) such as air bubbles. If the cap insulator 43 is not formed on the semiconductor layer 42, these voids may deteriorate roughness of the upper face of the semiconductor layer 42. The present embodiment makes it possible to prevent roughness of the upper face of the semiconductor layer 42 from being deteriorated by conducting laser annealing after forming the cap insulator 43 on the semiconductor layer 42. Since the melting point of a SiN film is higher than the melting point of a $SiO_2$ film, the insulator 43*b* (SiN film) makes it possible to effectively prevent deterioration of roughness due to the voids. On the other hand, the insulator 43*a* ($SiO_2$ film) is effective for adjusting reflectance of laser light. Therefore, the cap insulator 43 of the present embodiment includes the insulator 43*a* and the insulator 43*b*. In a case in which there is no need to adjust reflectance of laser light, the cap insulator 43 may include the insulator 43*b* alone.

It is also considered that the semiconductor layer 42 is made porous by wet treatment such as anode oxidation, for example. However, it is not possible to conduct wet treatment after the cap insulator 43 is formed on the semiconductor layer 42, and it may not be possible to prevent deterioration of roughness. It is therefore desirable to make the semiconductor layer 42 porous by laser annealing.

Laser annealing of the present embodiment is conducted such that the semiconductor layer 42 is made porous as a whole, but may alternatively be conducted such that only part of the semiconductor layer 42 is made porous. Therefore, in a step shown in FIG. 4A, the semiconductor layer 42 may be melted as a whole, or only part of the semiconductor layer 42 may be melted. In the case in which only part of the semiconductor layer 42 is made porous, the semiconductor layer 42 after being made porous will include a porous semiconductor layer (the semiconductor layer 42*a*) which is a layer having been made porous and a non-porous semiconductor layer which is a layer not having been made porous. The non-porous semiconductor layer is an amorphous semiconductor layer such as an amorphous Si layer, for example. The example of making only part of the semiconductor layer 42 porous will be described later.

Figure 4B:
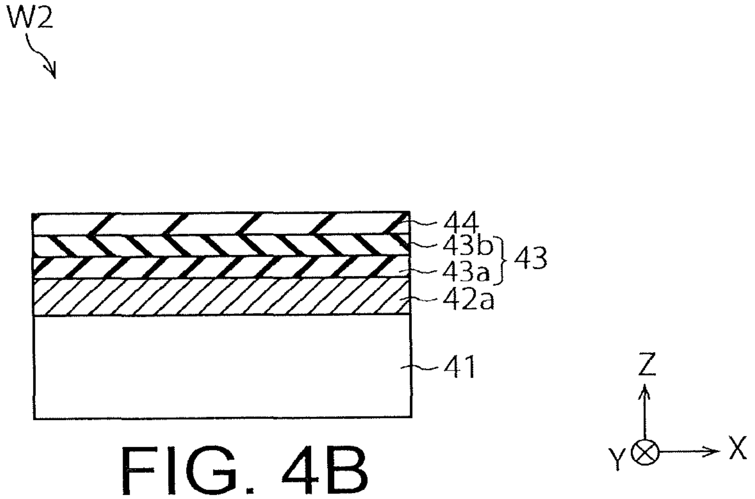

Next, an insulator 44 is formed on the cap insulator 43 (FIG. 4B). The insulator 44 is a $SiO_2$ film, for example.

Figure 4C:
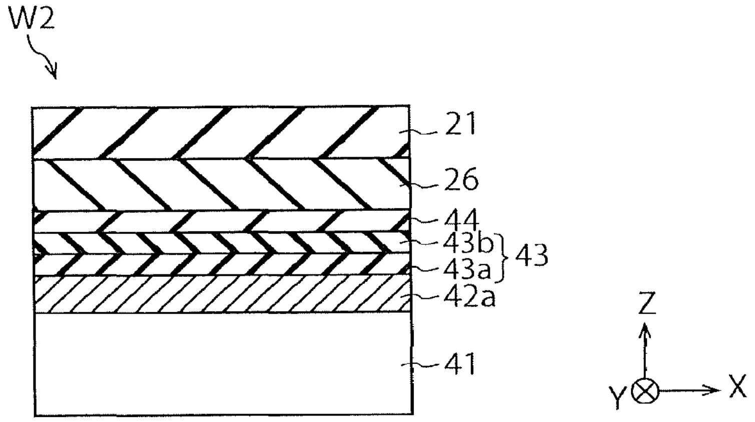

Next, the stacked film 26 and the inter layer dielectric 21 are sequentially formed on the insulator 44 (FIG. 4C). Details of the stacked film 26 and the inter layer dielectric 21 have been described above with reference to FIG. 1. FIG. 4C schematically shows a structure of the stacked film 26 and the inter layer dielectric 21. A step shown in FIG. 4C and subsequent steps will be described later with reference to FIGS. 5A to 9B.

FIGS. 5A to 9B are cross-sectional views showing details of the method of manufacturing the semiconductor device of the first embodiment.

Figure 5A:
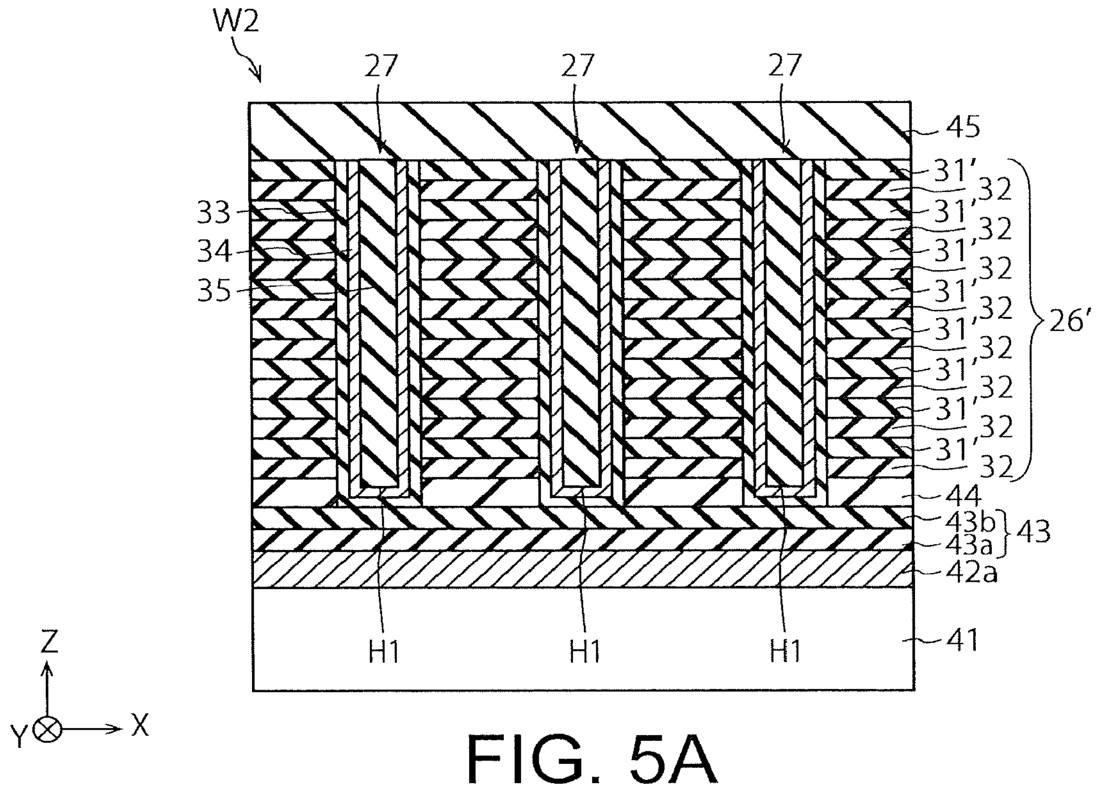
FIGS. 5A to 9B are cross-sectional views showing details of the method of manufacturing the semiconductor device of the first embodiment.

FIGS. 5A to 6B show details of the steps shown in FIGS. 4B and 4C. First, the insulator 44 is formed on the cap insulator 43, and a stacked film 26' is formed on the insulator 44 (FIG. 5A). The stacked film 26' is a film for forming the stacked film 26 by replacement treatment. The stacked film 26' is formed in a manner alternately including a plurality of sacrificial layers 31' and the plurality of insulating layers 32. The sacrificial layers 31' are SiN films, for example.

Next, a plurality of memory holes H1 extending through the stacked film 26' and the insulator 44 are formed, and the memory insulator 33, the channel semiconductor layer 34, and the core insulator 35 are sequentially formed in each of the memory holes H1 (FIG. 5A). As a result, the plurality of pillar portions 27 extending in the Z direction are formed in the memory holes H1. The memory insulator 33 is formed by sequentially forming the block insulator 33*a*, the charge storing layer 33*b*, and the tunnel insulator 33*c* in each of the memory holes H1 (see FIG. 2).

Next, an insulator 45 is formed on the stacked film 26' and the pillar portions 27 (FIG. 5A). The insulator 45 is a $SiO_2$ film, for example.

Figure 5B:
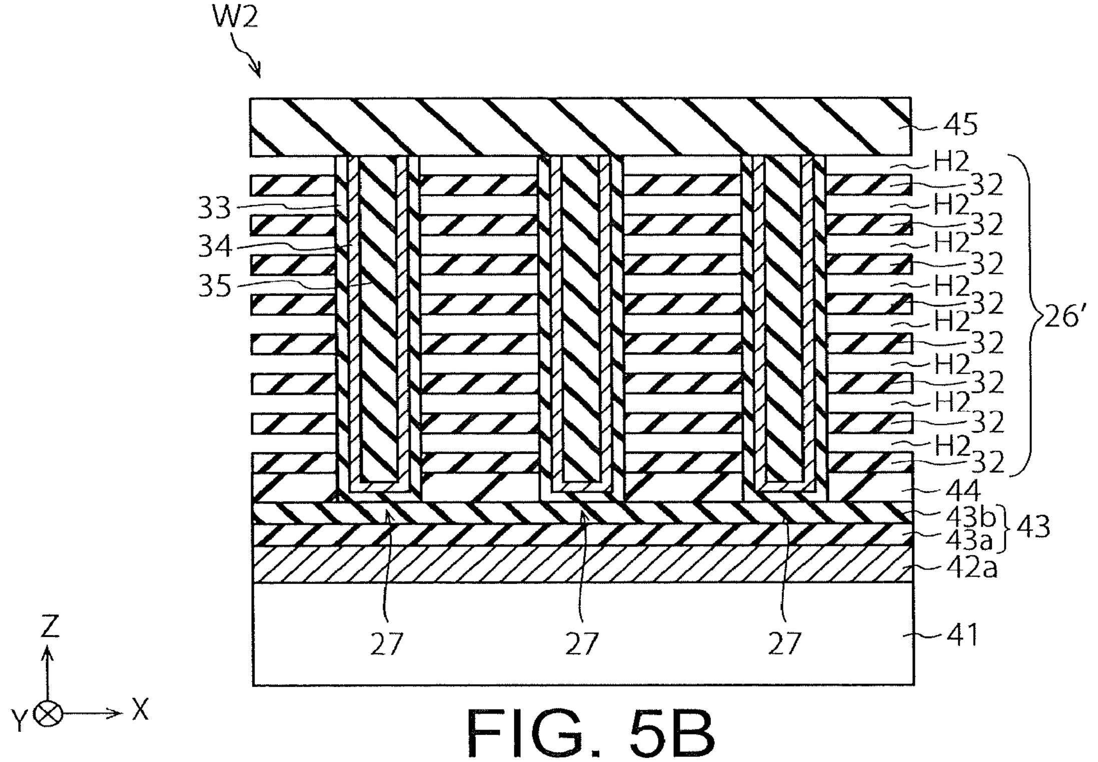

Next, slits (not shown) extending through the insulator 45 and the stacked film 26' are formed, and the sacrificial layers 31' are removed by wet etching through use of the slits (FIG. 5B). As a result, a plurality of cavities H2 are formed between the insulating layers 32 in the stacked film 26'.

Figure 6A:
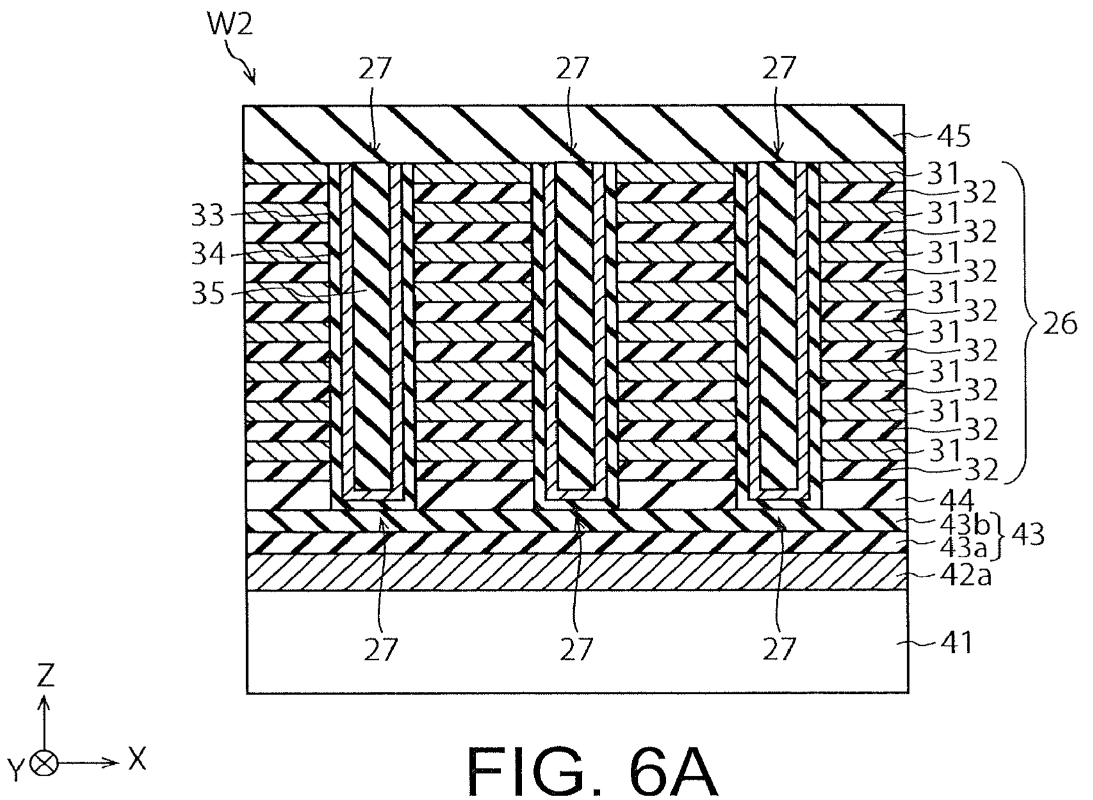

Next, the plurality of electrode layers 31 are formed in the cavities H2 through the slits (FIG. 6A). As a result, the stacked film 26 alternately including the plurality of electrode layers 31 and the plurality of insulating layers 32 is formed between the insulator 44 and the insulator 45 (replacement treatment). In addition, the structure in which the above-described plurality of pillar portions 27 extend through the stacked film 26 is formed above the substrate 41. When forming the electrode layers 31 in the respective cavities H2, the block insulator 39, the barrier metal layer 31*a*, and the electrode material layer 31*b* are sequentially formed in each of the cavities H2 (see FIG. 2).

Figure 6B:
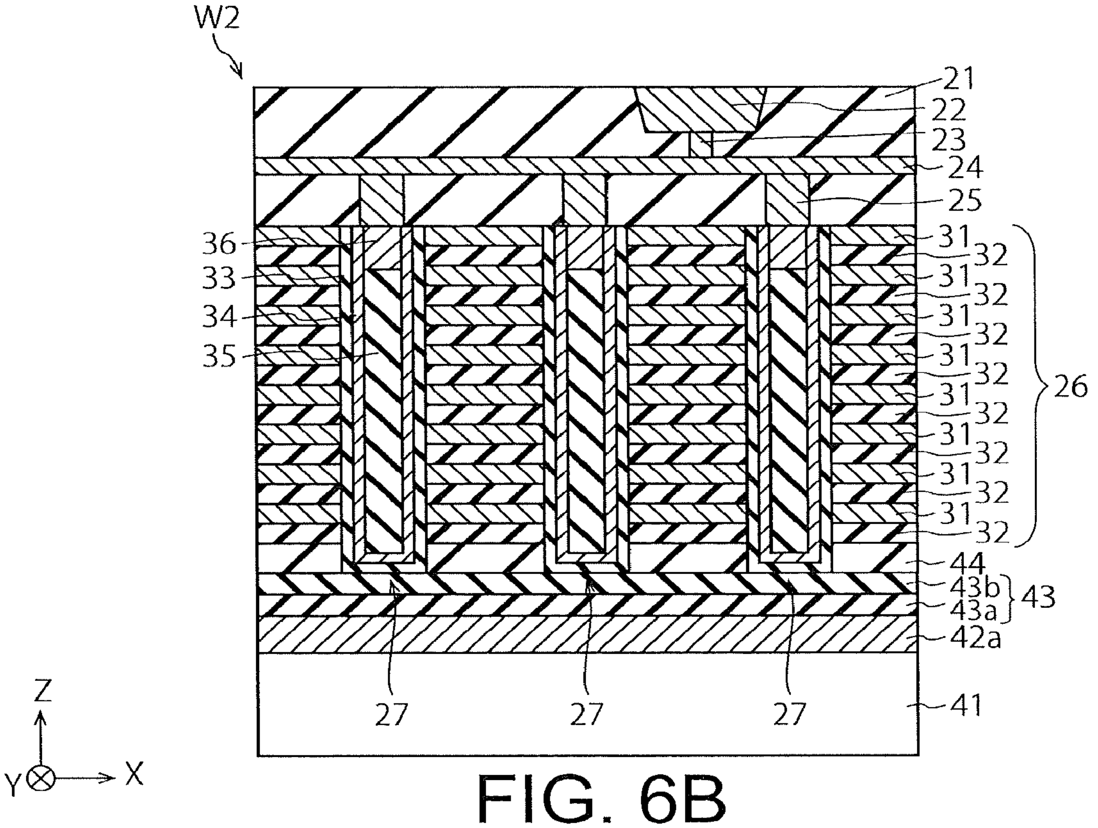

Next, the insulator 45 is removed, part of the core insulator 35 in each of the pillar portions 27 is removed, and the core semiconductor layer 36 is buried into a region in which part of the core insulator 35 has been removed (FIG. 6B). As a result, each of the pillar portions 27 is processed into a structure including the memory insulator 33, the channel semiconductor layer 34, the core insulator 35, and the core semiconductor layer 36.

Next, the inter layer dielectric 21, the metal pad 22, the via plug 23, the interconnect layer 24, and the plurality of contact plugs 25 are formed on the stacked film 26 and the pillar portions 27 (FIG. 6B). On this occasion, each of these contact plugs 25 is formed on the core semiconductor layer 36 of a corresponding one of the pillar portions 27, and the interconnect layer 24, the via plug 23, and the metal pad 22 are sequentially formed on these contact plugs 25. FIG. 6B shows the same state as the state shown in FIG. 4C.

Figure 7B:
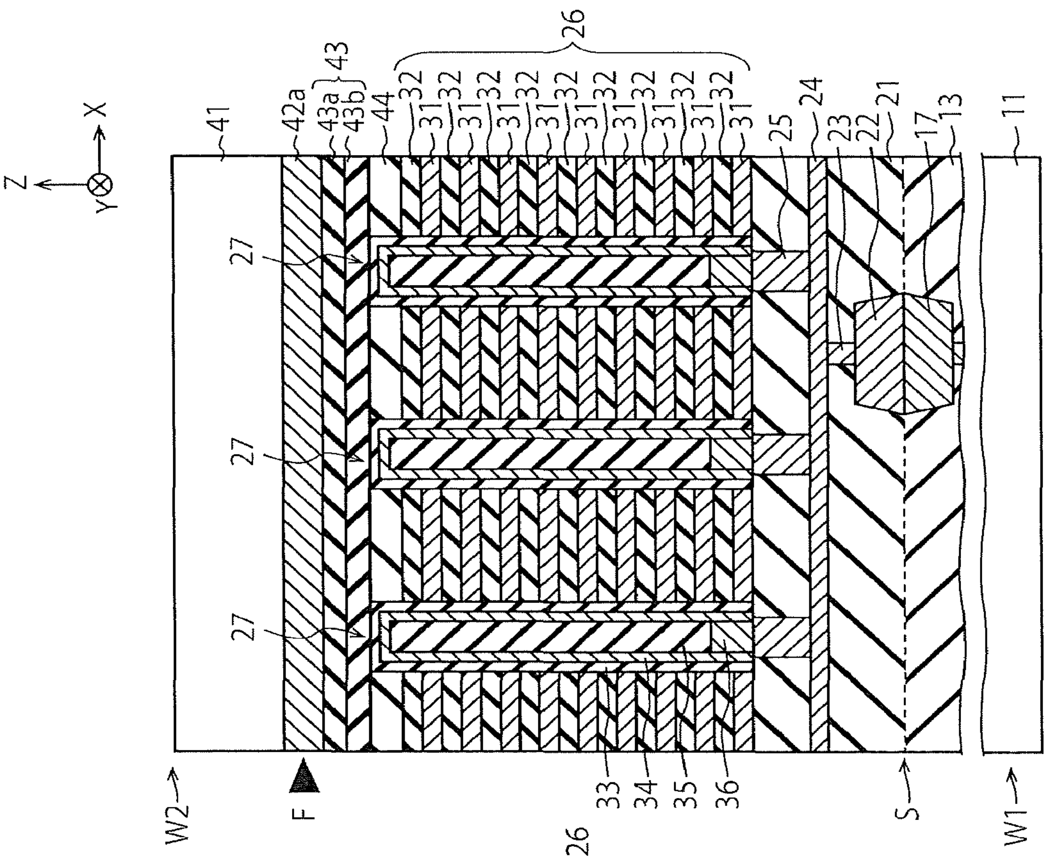
Figure 7A:
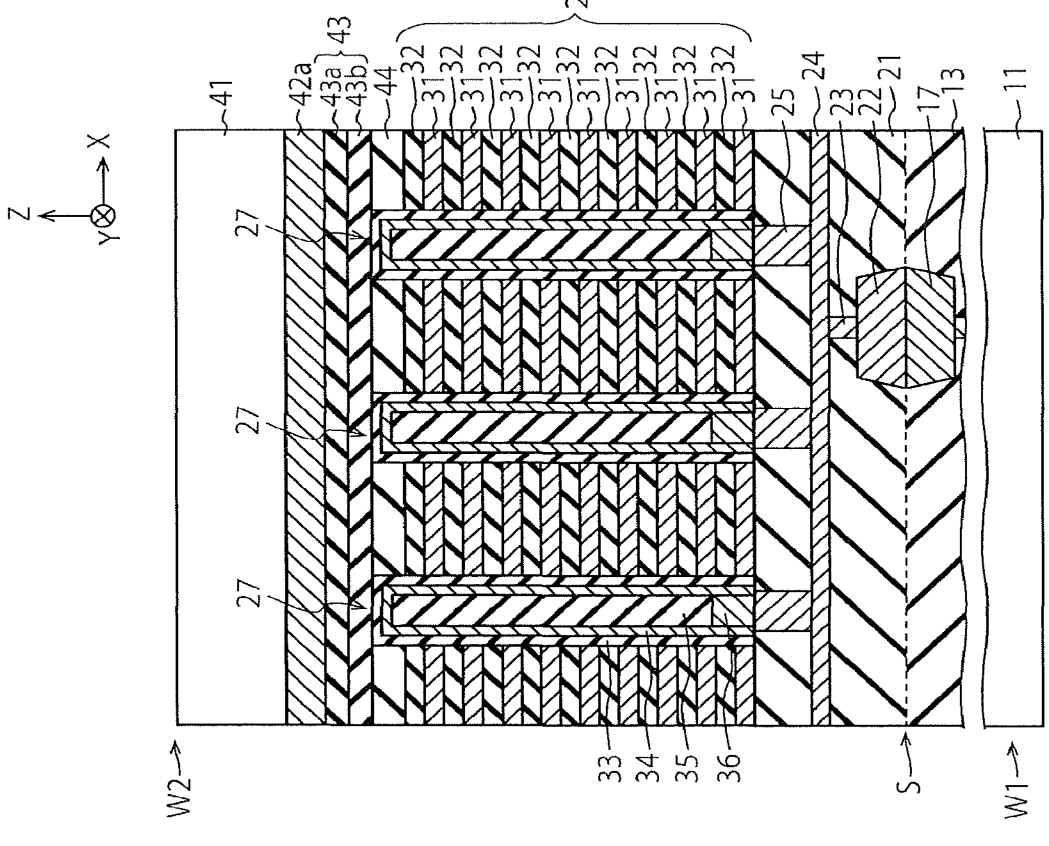

FIG. 7A shows a step (bonding step) of bonding the circuit wafer W1 and the array wafer W2. The circuit wafer W1 shown in FIG. 7A is manufactured by preparing the substrate 11, and forming the transistor 12, the inter layer dielectric 13, the plurality of contact plugs 14, the interconnect layer 15, the via plug 16, and the metal pad 17 on the substrate 11 (see FIG. 1). On this occasion, the transistor 12 is formed on the substrate 11, and these contact plugs 14 are formed on the substrate 11 or the transistor 12. In addition, the interconnect layer 15, the via plug 16, and the metal pad 17 are sequentially formed on these contact plugs 14.

Next, the orientation of the array wafer W2 is reversed, and the circuit wafer W1 and the array wafer W2 are bonded by mechanical pressure (FIG. 7A). As a result, the inter layer dielectric 13 and the inter layer dielectric 21 are stuck together. Next, the circuit wafer W1 and the array wafer W2 are annealed (FIG. 7A). As a result, the metal pad 17 and the metal pad 22 are joined. In this manner, the substrate 11 and the substrate 41 are bonded so as to sandwich the inter layer dielectrics 13 and 21, the stacked film 26, the insulator 44, the cap insulator 43, and the semiconductor layer 42*a*, and the substrate 41 is stacked above the substrate 11. Each of the metal pads 22 is arranged on a corresponding one of the metal pads 17.

Next, a physical force "F" is applied to the array wafer W2 with a blade or by water jet (FIG. 7B). For example, the force "F" is applied to the cross section of the semiconductor layer 42*a*. As a result, the semiconductor layer 42*a* is split. This makes it possible to separate the substrate 11 and the substrate 41 (FIG. 8A). In FIGS. 7A and 8A, since the force "F" is applied to the cross section of the semiconductor layer 42*a*, and the semiconductor layer 42*a* is split, the substrate 11 and the substrate 41 are separated at the position of the semiconductor layer 42*a*. As a result, part of the semiconductor layer 42*a* is left on the surface of the substrate 41, and a remaining part of the semiconductor layer 42*a* is left on the surface of the substrate 11. In addition, the memory cell array and the CMOS circuit described above are also left on the surface of the substrate 11. The semiconductor layer 42*a* is divided into the portion on the substrate 41 side and the portion on the substrate 11 side. The semiconductor layer 42*a* functions as a separating layer (detaching layer) for separating (detaching) the substrate 41 from the substrate 11.

The semiconductor layer 42*a* of the present embodiment is a porous semiconductor layer including a large number of voids, and is likely to be broken accordingly. This makes it possible to split the semiconductor layer 42*a* by applying the force "F" to the semiconductor layer 42*a*. In general, as the concentration of the impurity atoms in the semiconductor layer 42*a* is higher, a larger number of voids are produced in the semiconductor layer 42*a*, which makes the semiconductor layer 42*a* more likely to be broken. It is therefore desirable to set the concentration of the impurity atoms in the semiconductor layer 42*a* high, desirably at more than or equal to $1.0\times10^{21}/cm^3$, for example. The impurity atoms are H atoms or rare gas atoms (for example, He atoms), for example, as described above. The substrate 11 and the substrate 41 may be separated by splitting a material (for example, the cap insulator 43) other than the semiconductor layer 42*a* instead of the semiconductor layer 42*a* or together with the semiconductor layer 42*a*. In this case, the force "F" may be applied to this material.

In the present embodiment, the substrate 41 above the substrate 11 is removed by detaching the substrate 41 from the substrate 11 rather than scraping the substrate 41. This makes it possible to prevent the substrate 41 from being damaged, and to reuse the substrate 41. In the present embodiment, after separating the substrate 11 and the substrate 41, the semiconductor layer 42*a* and the like left on the surface of the substrate 41 are removed, and the substrate 41 is reused in the bonding step shown in FIG. 7A. This makes it possible to avoid wasteful use of many substrates 41. The force "F" may be applied to the semiconductor layer 42*a* mechanically with a blade or the like, may be applied fluidically by water jet or the like, or may be applied in another mode.

Figure 8B:
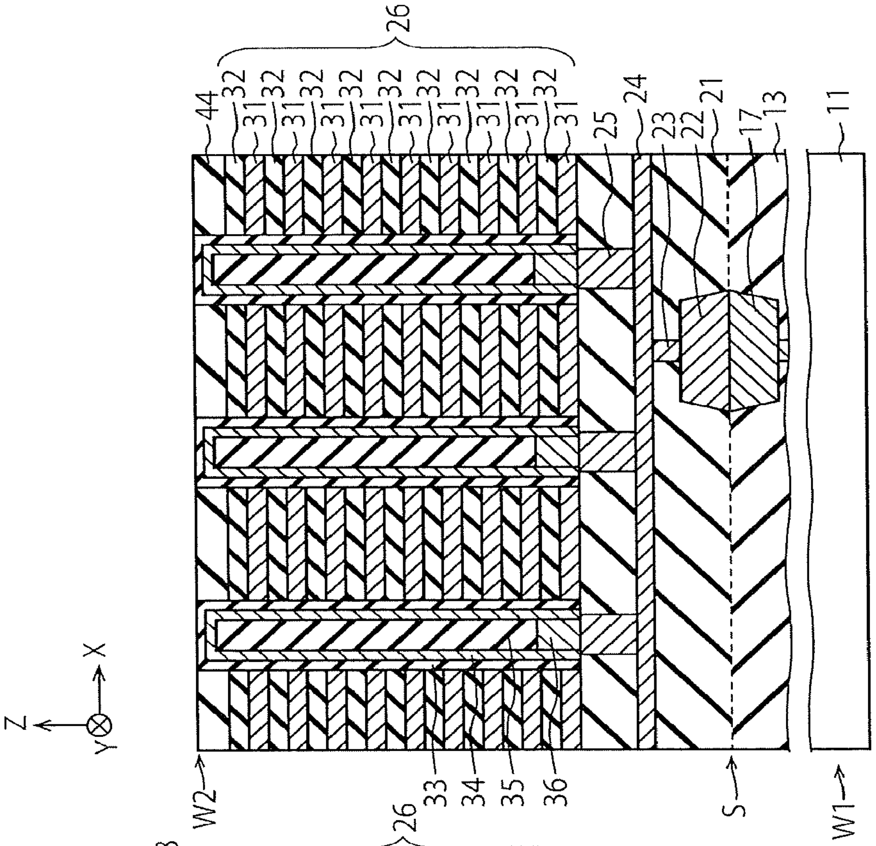
Figure 8A:
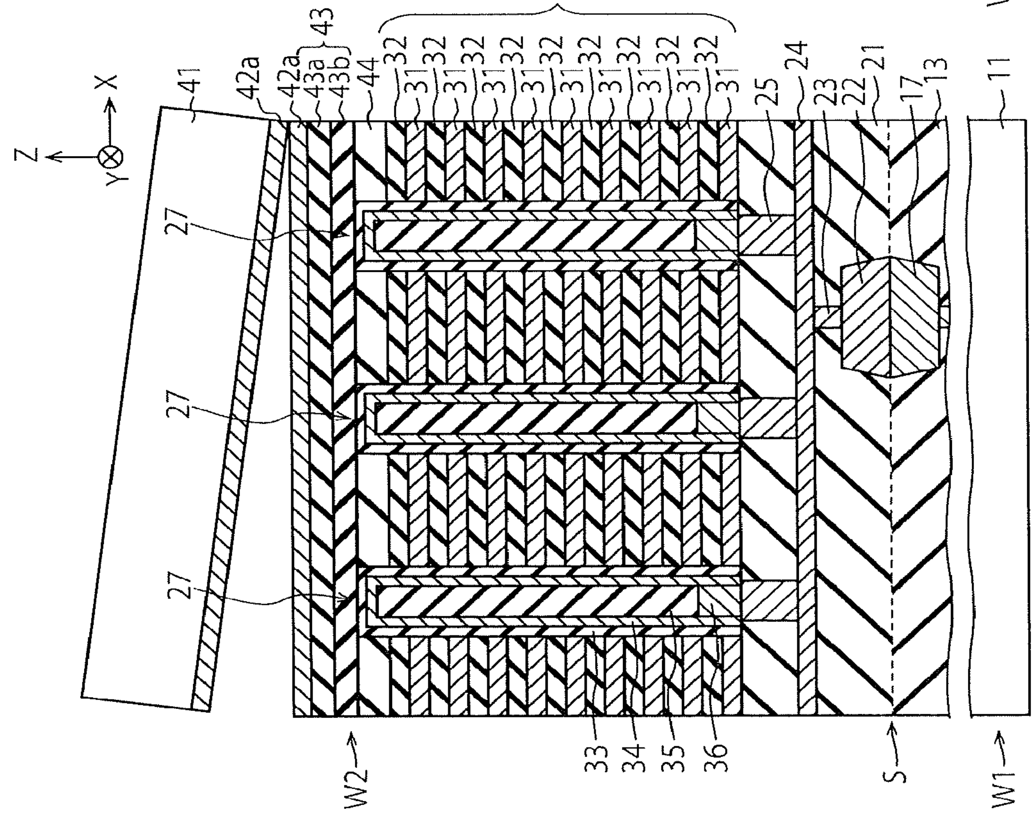

Next, the semiconductor layer 42*a* and the cap insulator 43 above the substrate 11 are removed (FIG. 8B). As a result, the insulator 44 and each of the pillar portions 27 are exposed at the upper side of the substrate 11. The step shown in FIG. 8B is performed by CMP (Chemical Mechanical Polishing) or etching, for example. In addition, in the step shown in FIG. 8B, the substrate 11 may be reduced in thickness by CMP or etching.

Figure 9B:
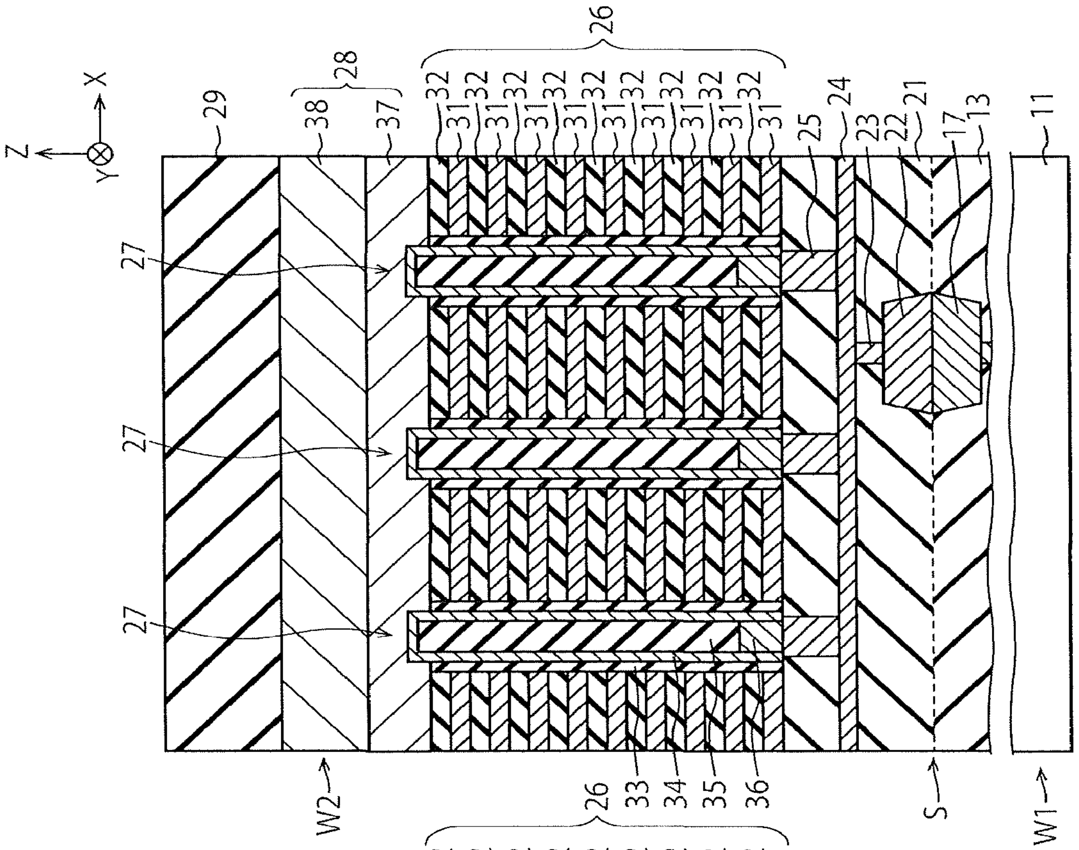
Figure 9A:
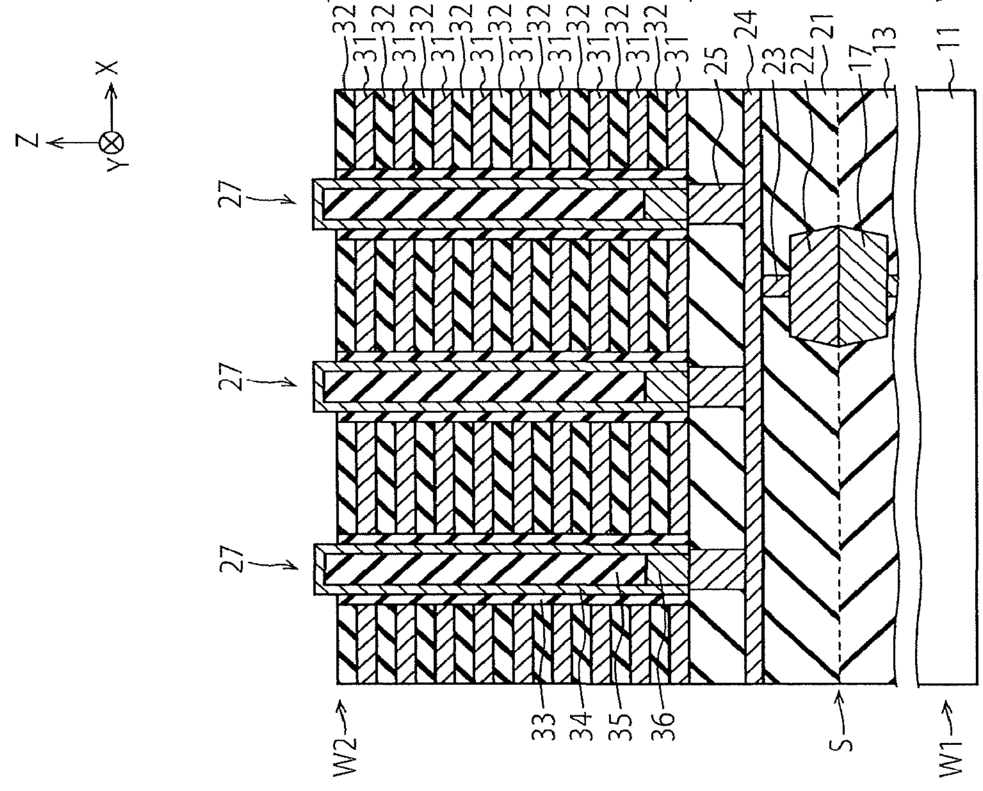

Next, the insulator 44 and part of the memory insulator 33 on each of the pillar portions 27 are removed by etching (FIG. 9A). The part of the memory insulator 33 to be removed is a portion exposed from the stacked film 26, for example. As a result, part of the channel semiconductor layer 34 on each of the pillar portions 27 is exposed from the memory insulator 33 at a position higher than the stacked film 26.

Next, the semiconductor layer 37, the metal layer 38, and the insulator 29 are sequentially formed on the stacked film 26 and the pillar portions 27 (FIG. 9B). As a result, the source layer 28 is formed on the channel semiconductor layer 34 on each of the pillar portions 27, and is electrically connected to the channel semiconductor layer 34 on each of the pillar portions 27.

Thereafter, the circuit wafer W1 and the array wafer W2 are cut into a plurality of chips. These chips are cut such that each of the chips includes the circuit region 1 and the array region 2. The semiconductor device of FIG. 1 is manufactured in this manner.

The semiconductor device of the present embodiment may be sold in the state shown in FIG. 1, or may be sold in the state shown in FIG. 6B or FIG. 7A.

Figure 10:
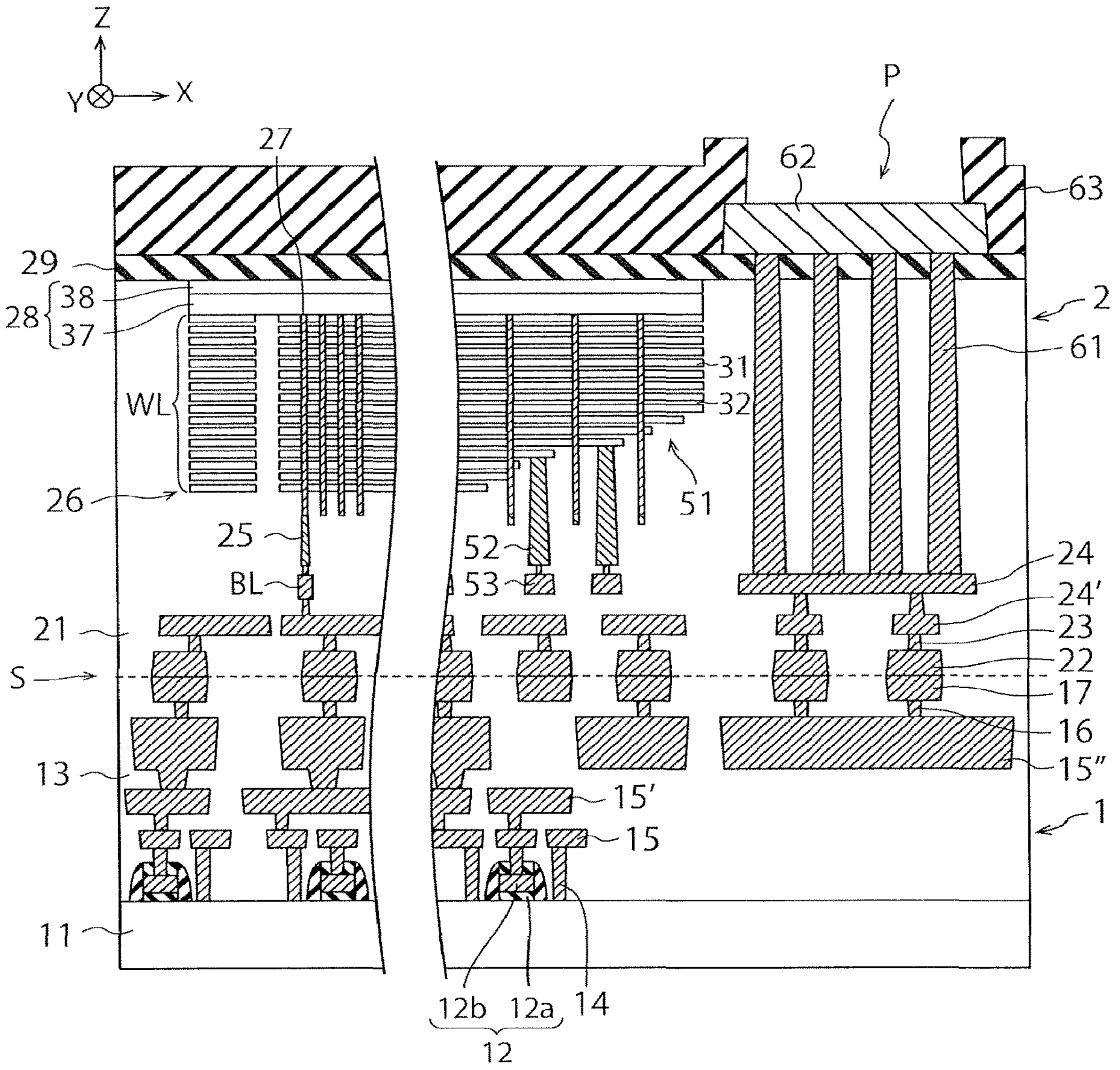
FIG. 10 is a cross-sectional view showing a structure of a semiconductor device of a modification of the first embodiment.

FIG. 10 is a cross-sectional view showing a structure of a semiconductor device of a modification of the first embodiment. The semiconductor device described with reference to FIGS. 1 to 9B may have the structure shown in FIG. 10 instead of having the structure shown in FIG. 1.

The semiconductor device of the present modification includes the circuit region 1 and the array region 2 similarly to the semiconductor device of the first embodiment. The circuit region 1 includes interconnect layers 15' and 15" that electrically connect the interconnect layer 15 and the via plug 16, in addition to the components shown in FIG. 1. The array region 2 includes an interconnect layer 24' that electrically connects the via plug 23 and the interconnect layer 24, in addition to the components shown in FIG. 1. Each of the interconnect layers 15', 15", and 24' includes a plurality of interconnects similarly to the interconnect layer 15 and the interconnect layer 24.

FIG. 10 shows a plurality of word lines WL (the electrode layers 31) in the stacked film 26, the plurality of pillar portions 27 extending through the stacked film 26, and a step structure portion 51 of the stacked film 26. Each of the word lines WL is electrically connected to a word interconnect layer 53 via a contact plug 52 in the step structure portion 51. The respective pillar portions 27 are electrically connected to bit lines BL via the contact plugs 25, and are electrically connected to the source layer 28. The word interconnect layer 53 and the bit lines BL of the present modification are included in the interconnect layer 24.

The array region 2 further includes a plurality of via plugs 61 provided on the interconnect layer 24, a metal pad 62 provided on these via plugs 61 and the insulator 29, and a passivation film 63 provided on the metal pad 62 and the insulator 29. The passivation film 63 is a stacked insulator including a silicon oxide film, a silicon nitride film, and the like, for example, and has an opening P at which an upper face of the metal pad 62 is exposed. The metal pad 62 is an external connection pad of the semiconductor device of the present modification, and is connectable to a mounting substrate or another device via solder balls, metal bumps, bonding wires, or the like.

Figure 11:
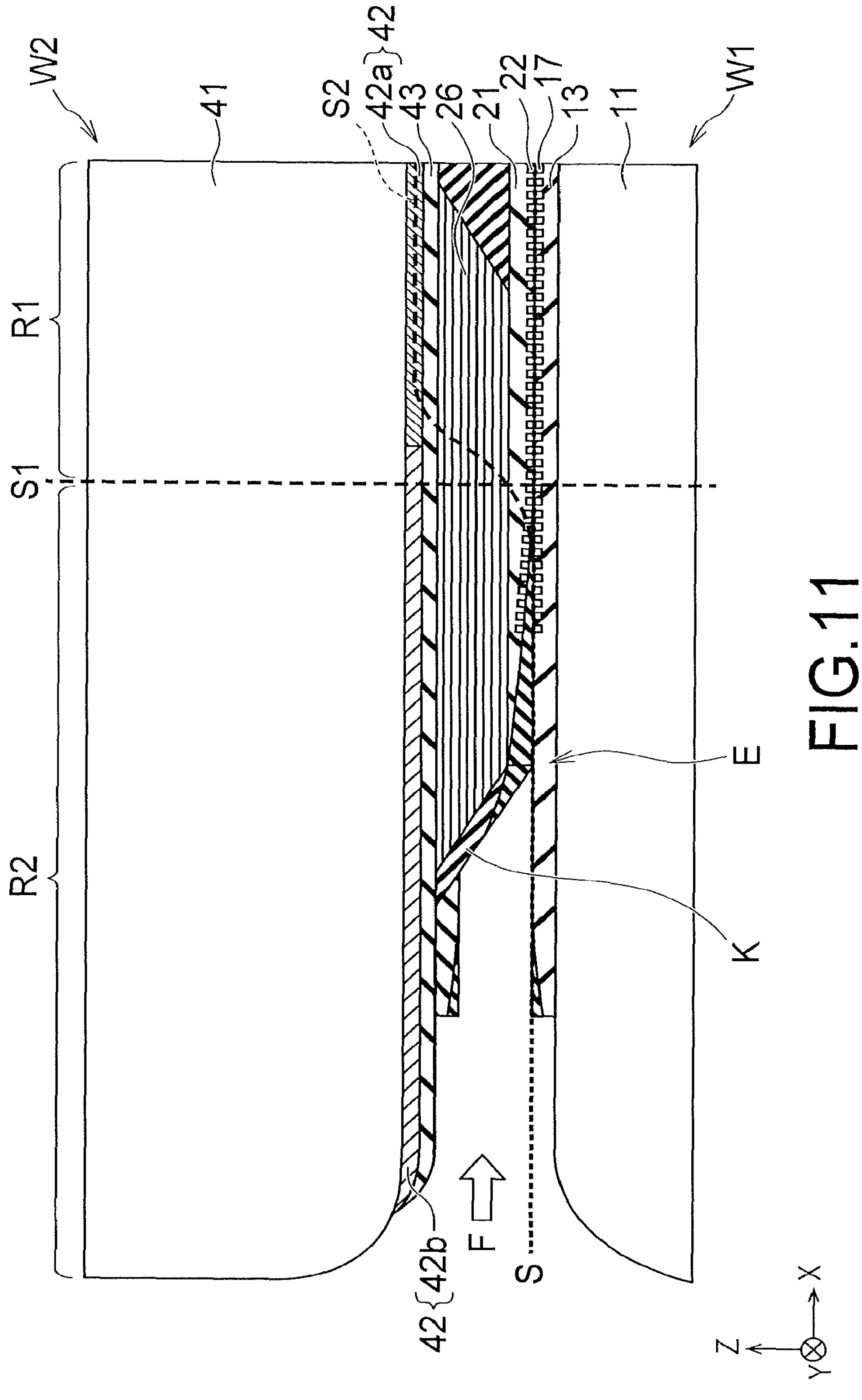
FIG. 11 is a cross-sectional view showing a method of manufacturing a semiconductor device of a comparative example of the first embodiment.
Figure 12:
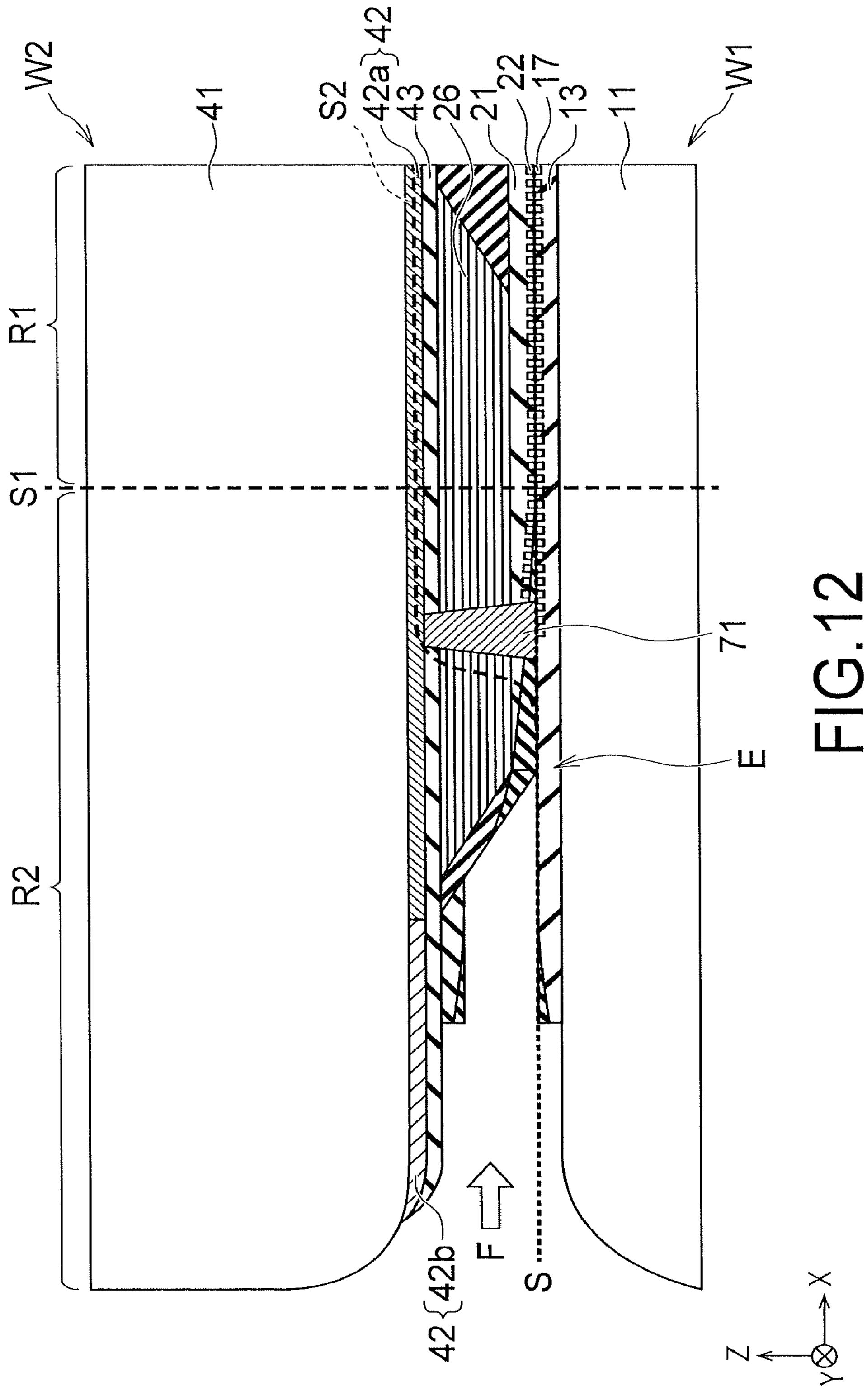
FIG. 12 is a cross-sectional view showing the semiconductor device of the first embodiment.

Next, the method of manufacturing the semiconductor device of the first embodiment and a method of manufacturing a semiconductor device of a comparative example of the first embodiment will be compared with reference to FIGS. 11 and 12.

FIG. 11 is a cross-sectional view showing the method of manufacturing the semiconductor device of the comparative example of the first embodiment.

FIG. 11 shows a step of applying the physical force “F” to the array wafer W2 similarly to the step shown in FIG. 7B. FIG. 11 shows the substrate 11, the inter layer dielectric 13, and the metal pad 17 in the circuit wafer W1, and the inter layer dielectric 21, the metal pad 22, the stacked film 26, the substrate 41, the semiconductor layer 42*a*, and the cap insulator 43 in the array wafer W2 similarly to FIG. 7B. In FIG. 11, illustration of the transistor 12, the interconnect layer 15, the interconnect layer 24, the pillar portions 27, the insulator 44, and the like is omitted. The reference character S indicates the position of a bonding face between the circuit wafer W1 and the array wafer W2.

FIG. 11 shows a region in the vicinity of ends (bevels) of the substrates 11 and 41. FIG. 11 shows regions R1 and R2 between the substrate 11 and the substrate 41, and a boundary S1 between these regions R1 and R2. The region R1 is a region for manufacturing a plurality of chips from the circuit wafer W1 and the array wafer W2, and is called an effective chip region. The region R1 therefore includes the memory cell array and the CMOS circuit described above. On the other hand, the region R2 is a region not to be used for these chips. The region R2 therefore does not include the memory cell array and the CMOS circuit described above. A region not to be used for these chips and not to be a device is called an ineffective chip region. The region R1 is located closer to the centers of the substrates 11 and 41, and has a nearly circular shape in plan view. The region R2 is located closer to the edges of the substrates 11 and 41, and has a nearly annular shape in plan view. The region R2 therefore annularly surrounds the region R1 in plan view. The region R1 is an example of a first region, and the region R2 is an example of a second region. Further details of the shapes of the regions R1 and R2 will be described later with reference to FIGS. 14A and 14B.

FIG. 11 further shows an insulator formed on the surface of the stacked film 26 and the like as indicated by a reference character K. Part of this insulator is interposed between the inter layer dielectric 13 including the metal pad 17 and the inter layer dielectric 21 including the metal pads 22. In FIG. 11, each of the metal pads 22 in the region R1 is arranged on a corresponding one of the metal pads 17, and is in contact with a corresponding one of the metal pads 17, while each of the metal pads 22 in the region R2 is arranged on the above-described insulator, and is not in contact with a corresponding one of the metal pads 17.

To be specific, each of the metal pads 17 and each of the metal pads 22 in the region R1 are electrically connected to devices such as the memory cell array and the CMOS circuit described above, and are not being electrically floating. The metal pads 17 and 22 in the region R1 are arranged so as to electrically connect the circuit wafer W1 and the array wafer W2. On the other hand, each of the metal pads 17 and each of the metal pads 22 in the region R2 are not electrically connected to devices such as the memory cell array and the CMOS circuit described above, and are being electrically floating.

A reference character E indicates an edge of the bonding face between the circuit wafer W1 and the array wafer W2. In FIG. 11, the bonding face between the circuit wafer W1 and the array wafer W2 extends from the vicinity of the centers of the substrates 11 and 41 to this edge E. The shape of the edge E is a nearly circular shape in plan view. The edge E is located in the region R2.

The present comparative example causes part of the semiconductor layer 42 to turn into the semiconductor layer 42*a* and a remaining portion of the semiconductor layer 42 to be left as the semiconductor layer 42*b* in a stage prior to the stage shown in FIG. 11. The semiconductor layer 42*a* is a porous semiconductor layer such as a porous poly-Si layer, for example. The semiconductor layer 42*b* is an amorphous semiconductor layer such as an amorphous Si layer, for example. In the present comparative example, the semiconductor layer 42*a* which is a porous layer and the semiconductor layer 42*b* which is a non-porous layer are formed in the semiconductor layer 42 by conducting the above-described laser annealing (see FIG. 3C). In the present comparative example, the semiconductor layer 42*a* is formed only in the region R1, and the semiconductor layer 42*b* is formed in the regions R1 and R2.

In FIG. 11, the substrate 11 and the substrate 41 are separated along a separation face S2 by applying the force "F" to the array wafer W2. The separation face S2 is a boundary face between the substrate 11 side and the substrate 41 side when the substrate 11 and the substrate 41 are separated, and is equivalent to a crack produced in the regions R1 and R2. In the region R1 of FIG. 11, the separation face S2 is formed in the semiconductor layer 42*a*, and the inter layer dielectric 13, the inter layer dielectric 21, the stacked film 26, and the like are left on the substrate 11 side. The memory cell array and the CMOS circuit are therefore left on the substrate 11 side, and the semiconductor device of FIG. 1 is manufactured from the memory cell array and the CMOS circuit left on the substrate 11 side.

However, the separation face S2 shown in FIG. 11 is also formed in the stacked film 26 in the region R1. This may deteriorate yield of chips to be manufactured from the region R1. It is therefore desirable to prevent the separation face S2 from being formed in the stacked film 26 in the region R1.

FIG. 12 is a cross-sectional view showing the semiconductor device of the first embodiment.

FIG. 12 shows the structure of the semiconductor device in the step shown in FIG. 7B, that is, the step of applying the physical force "F" to the array wafer W2. FIG. 12 shows the substrate 11, the inter layer dielectric 13, and the metal pads 17 in the circuit wafer W1, and the inter layer dielectric 21, the metal pads 22, the stacked film 26, the substrate 41, the semiconductor layer 42*a*, and the cap insulator 43 in the array wafer W2 similarly to FIG. 7B. In FIG. 12, illustration of the transistor 12, the interconnect layer 15, the interconnect layer 24, the pillar portions 27, the insulator 44, and the like is omitted.

In the structure shown in FIG. 12, the semiconductor layer 42*a* is formed in the regions R1 and R2, and the semiconductor layer 42*b* is formed only in the region R2. The semiconductor layer 42*a* shown in FIG. 12 is formed to the outside of the bonding face between the circuit wafer W1 and the array wafer W2 relative to the centers of the substrates 11 and 41. Therefore, in FIG. 12, a left end of the semiconductor layer 42*a* is located on the left side relative to a left end (the edge E) of the bonding face between the circuit wafer W1 and the array wafer W2.

The semiconductor layer 42*a* of the present embodiment is a porous semiconductor layer including a large number of voids, and is likely to be broken accordingly. Therefore, when the semiconductor layer 42*a* is formed in the regions R1 and R2, the separation face S2 is likely to be formed in the semiconductor layer 42*a* both in the region R1 and the region R2. This makes it possible to prevent the separation face S2 from being formed in the stacked film 26 in the region R1. In FIG. 12, the separation face S2 in the region R2 is formed not only in the semiconductor layer 42*a* but also in the stacked film 26, while the separation face S2 in the region R1 is formed only in the semiconductor layer 42*a*. The separation face S2 in the region R1 may be partly formed also in the cap insulator 43 unless being formed in the stacked film 26.

The array wafer W2 shown in FIG. 12 further includes a crack stopper layer 71 formed in the region R2. The crack stopper layer 71 is a layer for preventing a crack from being produced at an inner side relative to the position of the crack stopper layer 71. Therefore, the separation face S2 shown in FIG. 12 is not formed in the stacked film 26 or the like on the inner side relative to the crack stopper layer 71, and extends in the region R2 in a manner bypassing the crack stopper layer 71. The crack stopper layer 71 of the present embodiment is formed in the inter layer dielectric 21, the stacked film 26, and the cap insulator 43, and extends parallel to the Z direction which is the direction vertical to the surfaces of the substrates 11 and 41. The crack stopper layer 71 of the present embodiment extends across the stacked film 26 and the cap insulator 43 in the region R2. The crack stopper layer 71 is formed in the array wafer W2 before bonding the circuit wafer W1 and the array wafer W2, for example. The crack stopper layer 71 is an example of a first layer.

It is desirable to form the crack stopper layer 71 of a hard material in order to prevent a crack from being produced on the inner side relative to the position of the crack stopper layer 71. The crack stopper layer 71 is a metal layer, for example. When forming an interconnect layer (such as the interconnect layer 24, for example) in the array wafer W2, the crack stopper layer 71 may be formed of a metal material of the interconnect layer concurrently with the interconnect layer, similarly to the guard ring in the region R1. An XZ cross-sectional shape of the crack stopper layer 71 shown in FIG. 12 is trapezoidal, but may be another shape (rectangular or triangular, for example).

In the present embodiment, the semiconductor layer 42*a* is formed in the regions R1 and R2, and the crack stopper layer 71 is formed in the region R2. The separation face S2 in the region R2 is therefore likely to be formed in the semiconductor layer 42*a*. As a result, the separation face S2 is likely to be formed in the semiconductor layer 42*a* from the region R2 to the region R1. This makes it possible to more effectively prevent the separation face S2 from being formed in the stacked film 26 in the region R1.

The semiconductor layer 42*a* shown in FIG. 12 is formed to the outside of the crack stopper layer 71 relative to the centers of the substrates 11 and 41. Therefore, in FIG. 12, the left end of the semiconductor layer 42*a* is located on the left side relative to the left end of the crack stopper layer 71. This makes it possible to guide a crack in the vicinity of the crack stopper layer 71 toward the semiconductor layer 42*a*.

The semiconductor layer 42*a* shown in FIG. 12 is formed by causing part of the semiconductor layer 42 to turn into the semiconductor layer 42*a* and leaving a remaining portion of the semiconductor layer 42 as the semiconductor layer 42*b* in the steps shown in FIGS. 3C and 4A. On this occasion, causing the semiconductor layer 42 as a whole to turn into the semiconductor layer 42*a* eliminates the need for leaving the semiconductor layer 42 as the semiconductor layer 42*b*. This case also makes it possible to prevent the separation face S2 from being formed in the stacked film 26 in the region R1. However, when the semiconductor layer 42 as a whole is caused to turn into the semiconductor layer 42*a*, a device that holds the array wafer W2 may be brought into contact with the semiconductor layer 42*a* or the vicinity of the semiconductor layer 42*a*, thereby damaging the semiconductor layer 42*a*. This is because the semiconductor layer 42*a* is likely to be broken. On the other hand, if the semiconductor layer 42 is left as the semiconductor layer 42*b*, it is possible to prevent such a damage because the semiconductor layer 42*b* is less likely to be broken.

The force "F" may be applied to the array wafer W2 mechanically with a blade or the like, may be applied fluidically by water jet or the like, or may be applied in another mode as described above. The force "F" may be applied to any portion of the array wafer W2 such as the stacked film 26, the cap insulator 43, the semiconductor layers 42*a* and 42*b*, or the insulator indicated by the reference character K (see FIG. 11) as long as the separation face S2 can be formed. The force "F" may be applied to a portion of the circuit wafer W1 (the inter layer dielectric 13, for example) as long as the separation face S2 can be formed.

FIG. 12 shows the regions R1 and R2, while FIGS. 1 to 10 described above show part of the region R1. Further details of the regions R1 and R2 will be described later with reference to FIGS. 14A and 14B.

Figure 13:
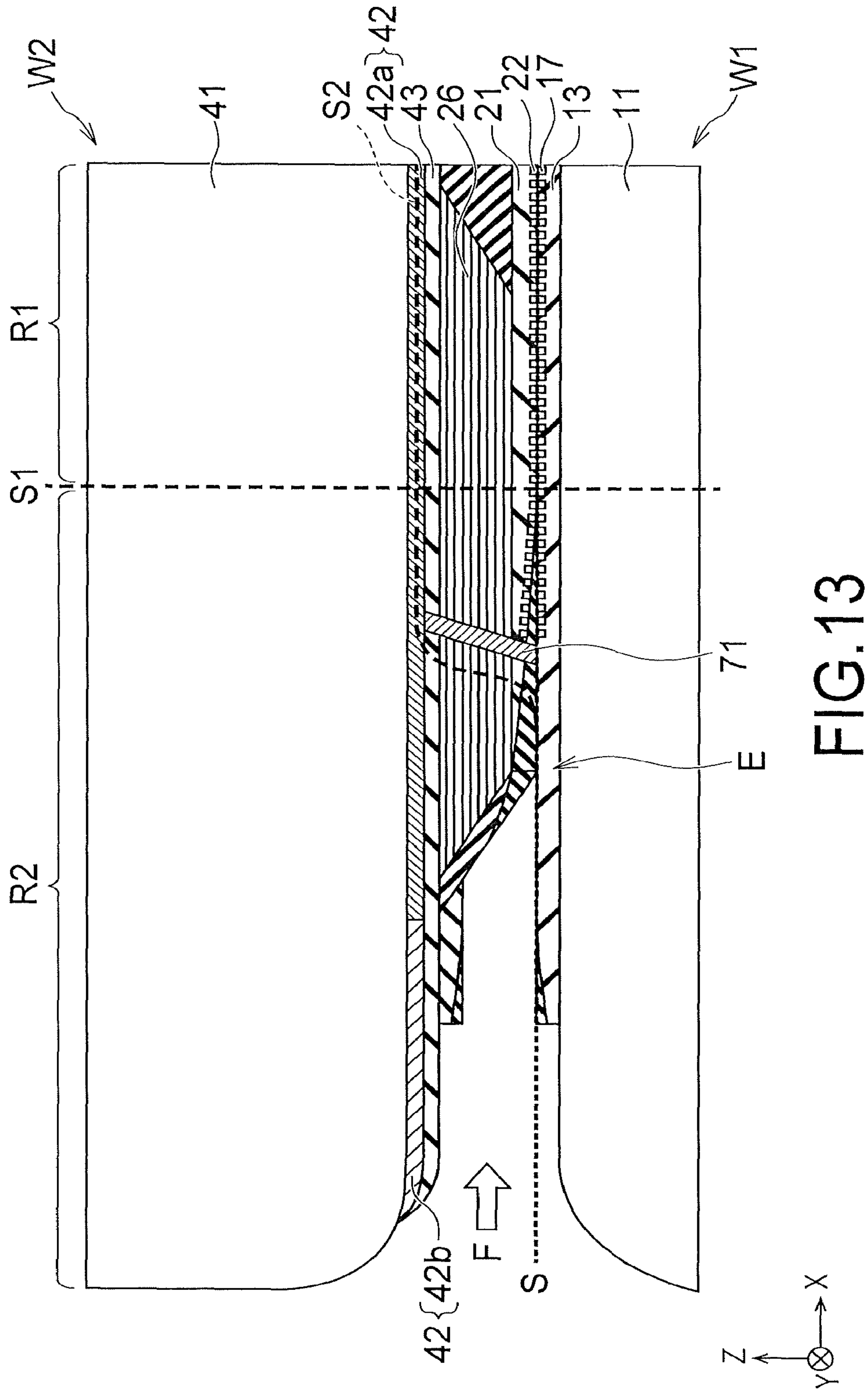
FIG. 13 is a cross-sectional view showing a method of manufacturing a semiconductor device of a modification of the first embodiment.

FIG. 13 is a cross-sectional view showing a method of manufacturing a semiconductor device of a modification of the first embodiment.

FIG. 13 also shows the step shown in FIG. 7B, that is, the step of applying the physical force "F" to the array wafer W2. The structure shown in FIG. 13 is substantially the same as the structure shown in FIG. 12. However, the crack stopper layer 71 shown in FIG. 13 extends in a direction inclined from the Z direction. An XY cross-sectional shape of the crack stopper layer 71 shown in FIG. 13 is parallelogram. In this manner, the crack stopper layer 71 can be implemented in various modes.

Figure 14B:
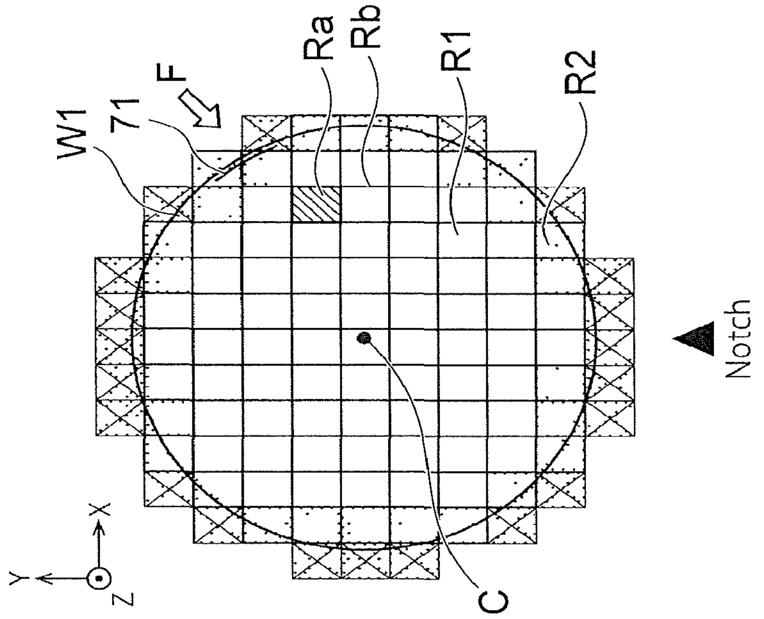
FIGS. 14A and 14B are plan views showing the method of manufacturing the semiconductor device of the first embodiment.
Figure 14A:
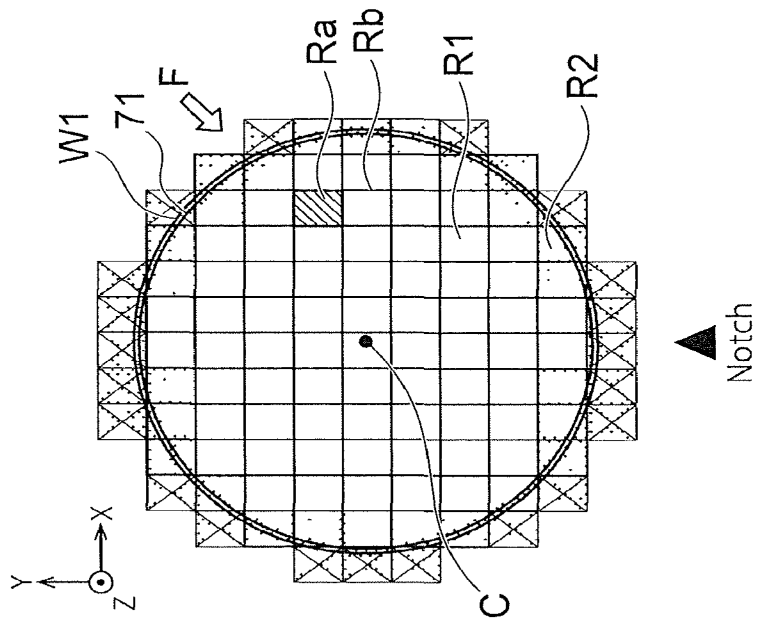

FIGS. 14A and 14B are plan views showing the method of manufacturing the semiconductor device of the first embodiment.

FIG. 14A shows a contour, a notch, and the position of a center C of the circuit wafer W1 shown in FIG. 12. The circuit wafer W1 and the array wafer W2 are bonded such that the contour, the notch, and the position of the center are substantially the same in plan view. The contour, the notch, and the position of the center of the array wafer W2 are therefore substantially the same as a contour, a notch, and the position of a center of the circuit wafer W1, respectively, in plan view.

FIG. 14A further shows a plurality of regions Ra between the circuit wafer W1 and the array wafer W2, and the regions Rb between these regions Ra. Each of the regions Ra is a region having a single chip size. A region indicated by diagonal hatching in FIG. 14A represents one of the regions Ra. The regions Rb are scribe regions (dicing regions) for cutting the circuit wafer W1 and the array wafer W2 into a plurality of chips. The regions Rb are shaped to include a plurality of scribe lines extending in the X direction and a plurality of scribe lines extending in the Y direction.

FIG. 14A further shows the position of the crack stopper layer 71 provided in the array wafer W2. The crack stopper layer 71 shown in FIG. 14A has an annular shape in plan view, and extends in a circumferential direction along the contour of the array wafer W2. The force "F" may be applied to any position of the cross section of the array wafer W2, and is applied to an upper right position of the array wafer W2 in FIG. 14A.

FIG. 14A further shows the regions R1 and R2 described above. The region R2 is shown as a region with dot hatching (excluding a region located outside the circuit wafer W1 and the array wafer W2 in plan view), and the region R1 is shown as a region without dot hatching. The region R1 is a region (an effective chip region) for manufacturing a plurality of chips from the circuit wafer W1 and the array wafer W2. The region R2 is a region not to be used for these chips.

The region R1 shown in FIG. 14A includes 66 regions Ra and the regions Rb between these regions Ra. The region R2 shown in FIG. 14B includes the other regions Ra and the regions Rb between these regions Ra. The region R1 is located closer to the centers C of the wafers W1 and W2 (the substrates 11 and 41), and has a nearly circular shape in plan view. The region R2 is located closer to the edges of the wafers W1 and W2 (the substrates 11 and 41), and has a nearly annular shape in plan view. The region R2 therefore annularly surrounds the region R1 in plan view. The number of the regions Ra in the region R1 may be other than 66.

In FIG. 14A, the crack stopper layer 71 is formed in the region R2 in a manner annularly surrounding the region R1. This makes it possible to effectively prevent a crack from being produced in the stacked film 26 in the region R1 by virtue of the crack stopper layer 71.

The circuit wafer W1 and the array wafer W2 may include a guard ring in each of the regions Ra. The guard ring is a ring provided along the contour of each of the regions Ra, and provided in order to prevent water from entering the chips and to prevent films in the chips from being detached from each other. When forming interconnect layers (such as the interconnect layers 15 and 24, for example) in the circuit wafer W1 and the array wafer W2, for example, the guard ring is formed of a metal material of the interconnect layers concurrently with the interconnect layers. The crack stopper layer 71 of the present embodiment may be formed of the metal material of the interconnect layers concurrently with the interconnect layers, similarly to the guard ring.

The crack stopper layer 71 may have the shape shown in FIG. 14B instead of the shape shown in FIG. 14A. The crack stopper layer 71 shown in FIG. 14B has a non-annular shape in plan view, and to be specific, is formed only in the vicinity of a position to which the force "F" is to be applied. A crack into the stacked film 26 in the region R1 is likely to be produced in the vicinity of the position to which the force "F" is to be applied. Therefore, the crack stopper layer 71 having the shape shown in FIG. 14B also makes it possible to effectively prevent a crack from being produced in the stacked film 26 in the region R1.

Figure 15A:
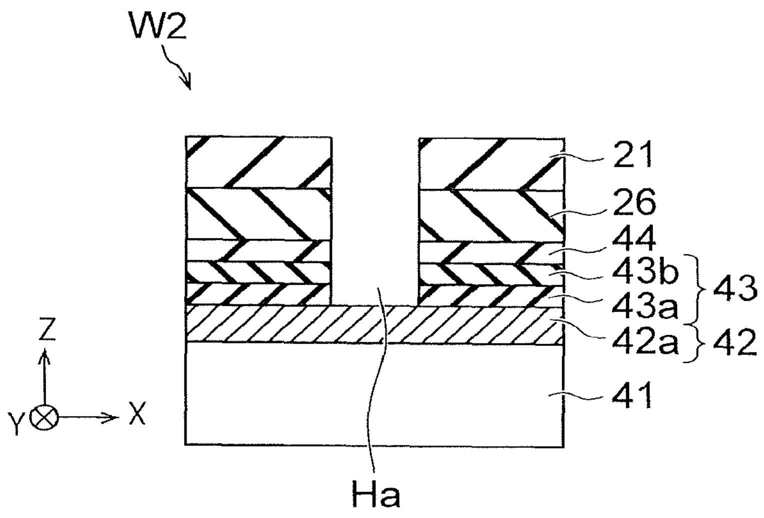
FIGS. 15A and 15B are cross-sectional views showing details of the method of manufacturing the semiconductor device of the first embodiment.
Figure 15B:
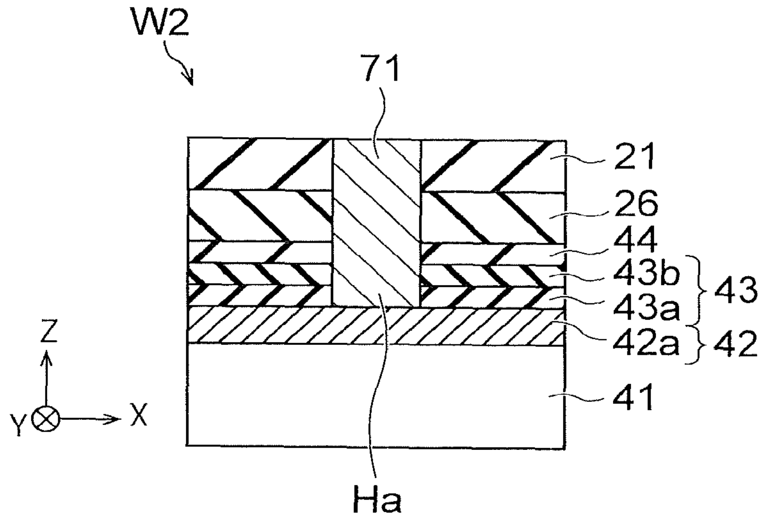

FIGS. 15A and 15B are cross-sectional views showing details of the method of manufacturing the semiconductor device of the first embodiment.

FIG. 15A shows the array wafer W2 shown in FIG. 14B. In FIG. 15A, an opening Ha is formed in the inter layer dielectric 21, the stacked film 26, the insulator 44, and the cap insulator 43. Next, the crack stopper layer 71 is formed in the opening Ha (FIG. 15B). In this manner, the crack stopper layer 71 is formed in the array wafer W2. Thereafter, the array wafer W2 is bonded to the circuit wafer W1.

When forming the crack stopper layer 71 shown in FIG. 14A, the opening Ha having an annular shape is formed. On the other hand, when forming the crack stopper layer 71 shown in FIG. 14B, the opening Ha having a non-annular shape is formed.

As described above, the semiconductor layer 42*a* (porous layer) of the present embodiment is formed in the regions R1 and R2. The present embodiment therefore makes it possible to suitably separate the substrate 11 and the substrate 41 after bonding by, for example, making it possible to prevent the separation face S2 from being formed in the stacked film 26 in the region R1. This makes it possible to reuse the substrate 41 separated from the substrate 11.

In addition, the substrate 11 and the substrate 41 of the present embodiment are separated in a state in which the crack stopper layer 71 is provided in the region R2. The present embodiment therefore makes it possible to more suitably separate the substrate 11 and the substrate 41 after bonding by restricting the position at which the separation face S2 is to be formed.

Second Embodiment

Figure 16:
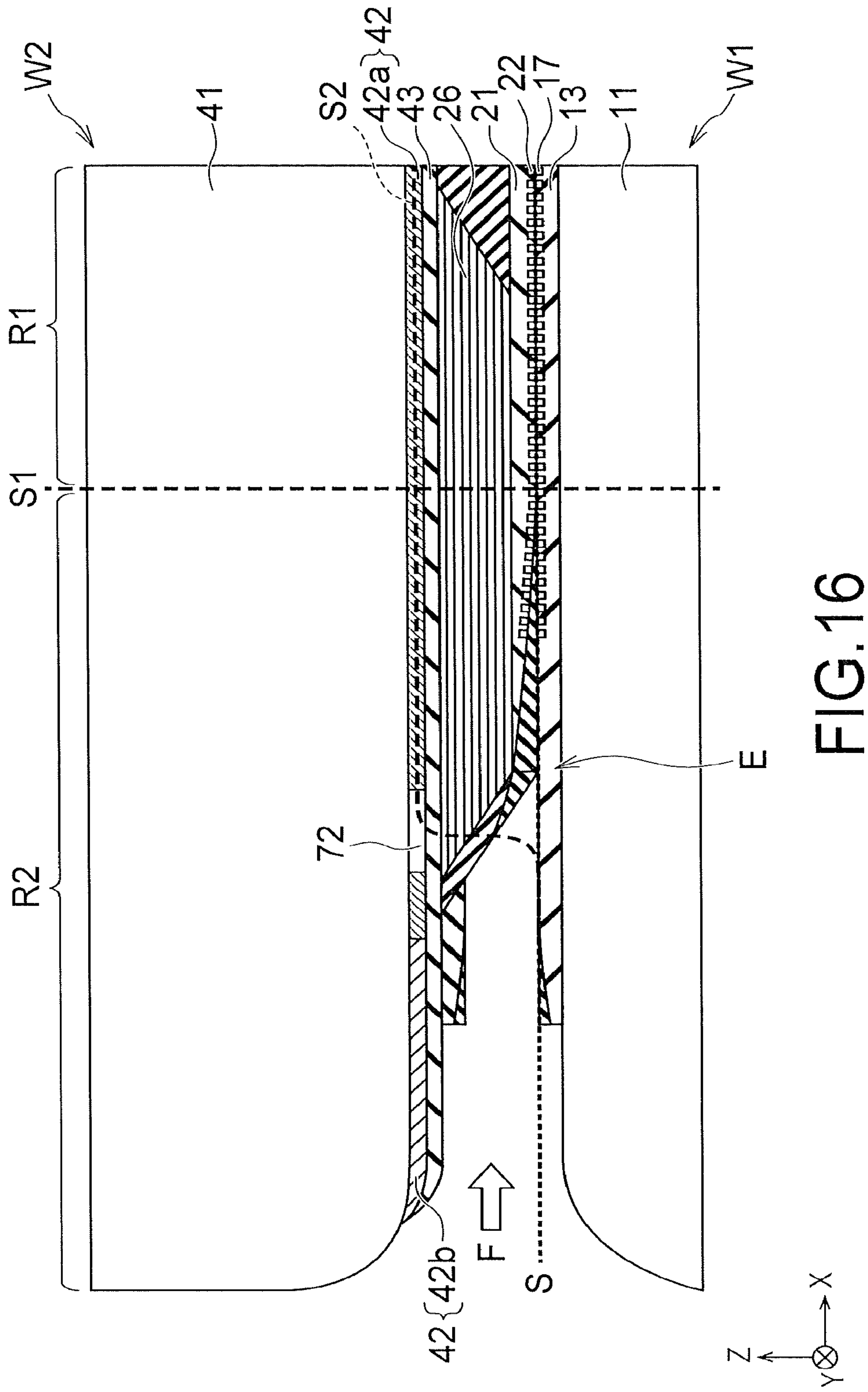
FIG. 16 is a cross-sectional view showing a semiconductor device of a second embodiment.

FIG. 16 is a cross-sectional view showing a semiconductor device of a second embodiment.

FIG. 16 shows a structure of the semiconductor device in the step shown in FIG. 7B, that is, the step of applying the physical force "F" to the array wafer W2, similarly to FIGS.

11 to 13. The structure shown in FIG. 16 includes an air gap 72 instead of the crack stopper layer 71 as compared with the structure shown in FIG. 12. The air gap 72 is formed in the array wafer W2 before bonding the circuit wafer W1 and the array wafer W2, for example.

The air gap 72 shown in FIG. 16 is formed in the semiconductor layer 42*a* in the region R2, and extends through the semiconductor layer 42*a*. The air gap 72 is an origin at which a crack is produced in the array wafer W2. This makes it easy for the separation face S2 to pass through the air gap 72 as shown in FIG. 16 when the substrate 11 and the substrate 41 are separated along the separation face S2. The present embodiment therefore makes it possible to form the separation face S2 that passes through the air gap 72 by forming the air gap 72 in the semiconductor layer 42*a* in the region R2, and to form the separation face S2 in the semiconductor layer 42*a* in the region R2. This makes it possible to prevent the separation face S2 from being formed in the stacked film 26 in the region R1.

Figure 17:
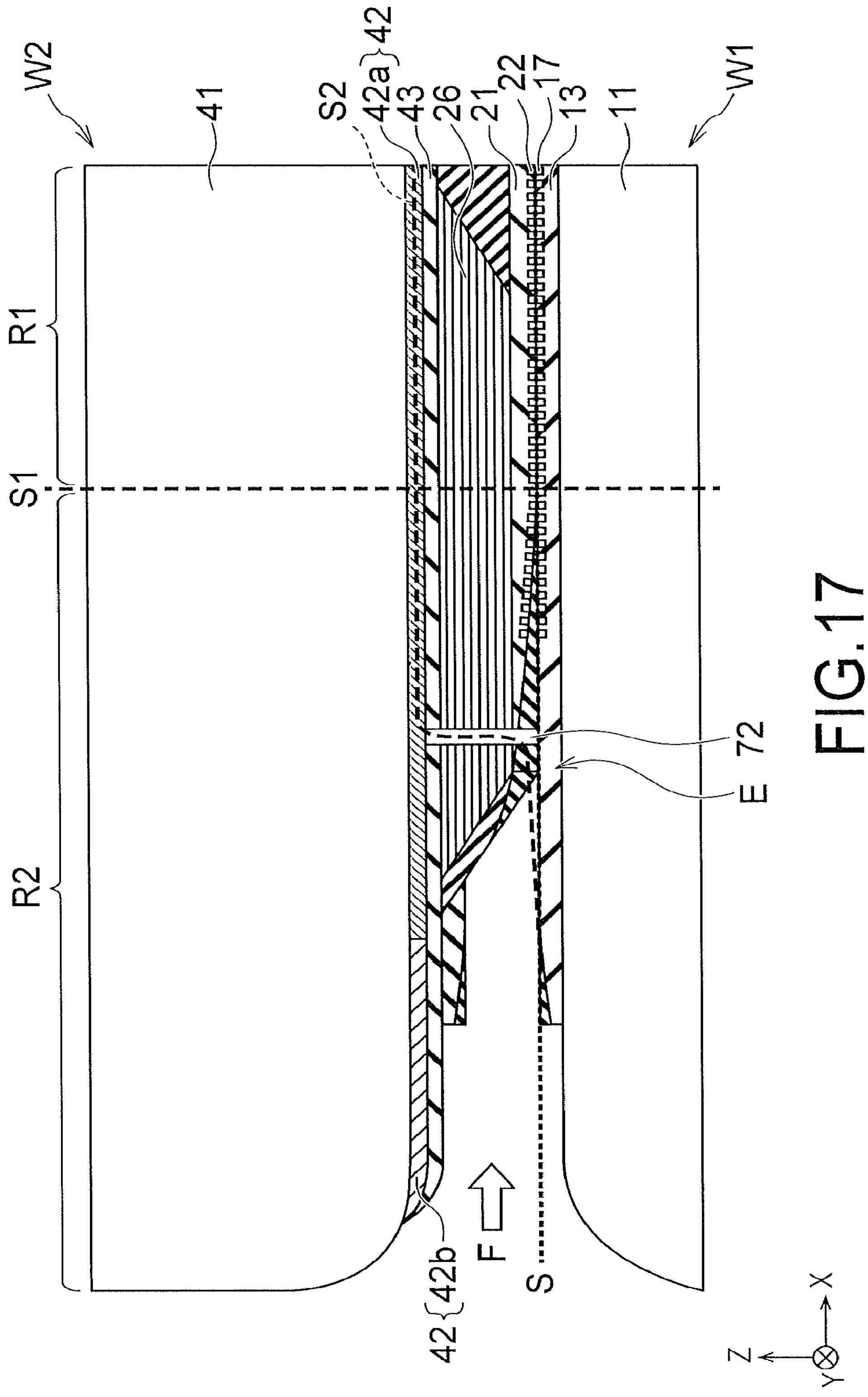
FIG. 17 is a cross-sectional view showing a method of manufacturing a semiconductor device of a modification of the second embodiment.

FIG. 17 is a cross-sectional view showing a method of manufacturing a semiconductor device of a modification of the second embodiment.

FIG. 17 also shows the step shown in FIG. 7B, that is, the step of applying the physical force "F" to the array wafer W2. The structure shown in FIG. 17 is substantially the same as the structure shown in FIG. 16. However, the air gap 72 shown in FIG. 17 is formed in a manner extending through the cap insulator 43, the stacked film 26, and the inter layer dielectric 21 in the region R2. This makes it possible to prevent the separation face S2 from being formed in the stacked film 26 in the region R1.

The air gap 72 shown in FIG. 17 may further be formed in the semiconductor layer 42*a* in a manner extending through or not extending through the semiconductor layer 42*a*.

Figure 18:
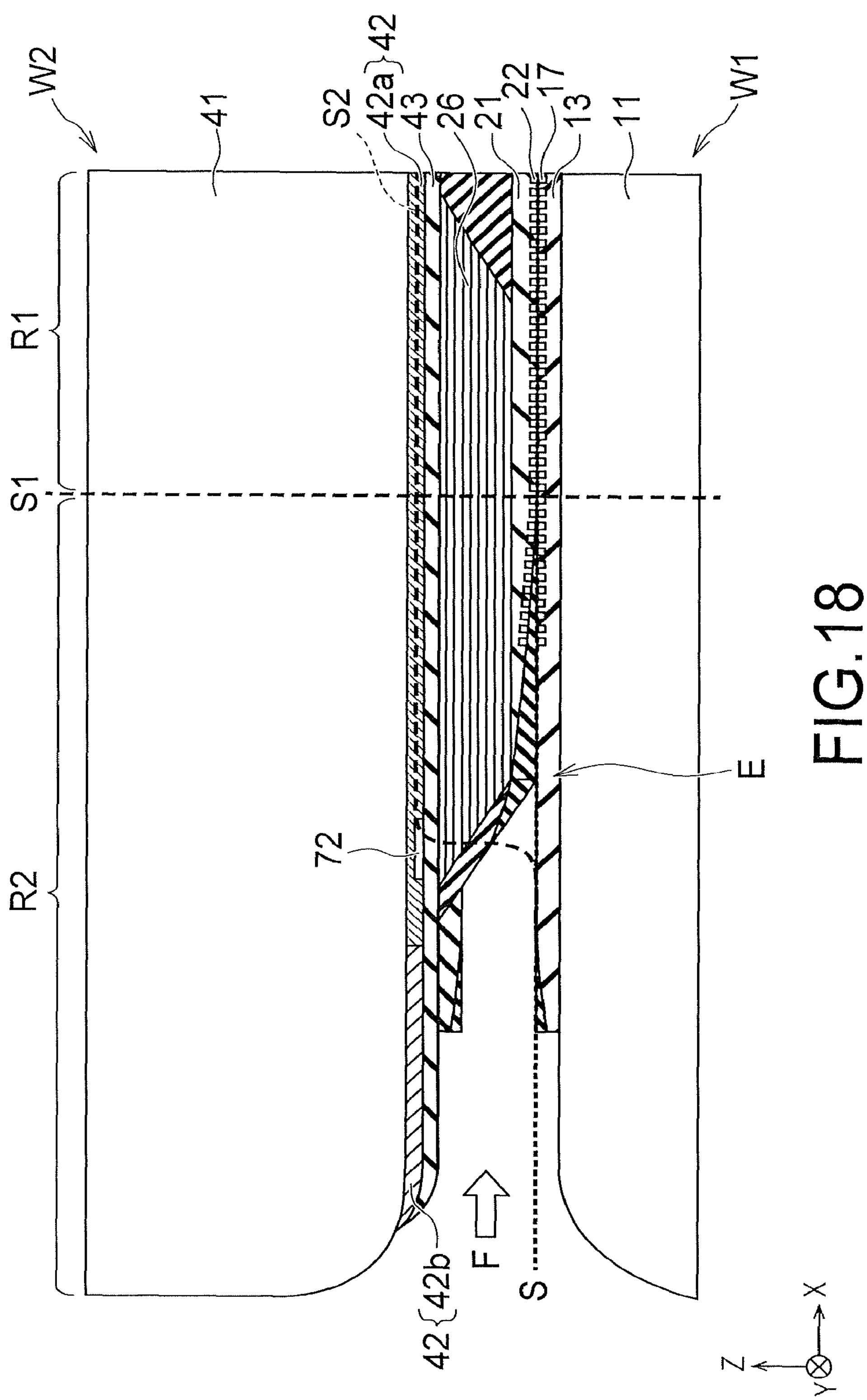
FIG. 18 is a cross-sectional view showing a method of manufacturing a semiconductor device of another modification of the second embodiment.

FIG. 18 is a cross-sectional view showing a method of manufacturing a semiconductor device of another modification of the second embodiment.

FIG. 18 also shows the step shown in FIG. 7B, that is, the step of applying the physical force "F" to the array wafer W2. The structure shown in FIG. 18 is substantially the same as the structure shown in FIG. 16. However, the air gap 72 shown in FIG. 18 is formed in the semiconductor layer 42*a* in a manner not extending through the semiconductor layer 42*a* in the region R2. This makes it possible to prevent the separation face S2 from being formed in the stacked film 26 in the region R1.

A thickness of the air gap 72 shown in FIG. 18 is more than or equal to 50% of a thickness of the semiconductor layer 42*a*, for example. However, the thickness of the air gap 72 may have another value. The air gap 72 shown in FIG. 18 is equivalent to a recess provided in the surface of the semiconductor layer 42*a*.

Figure 19:
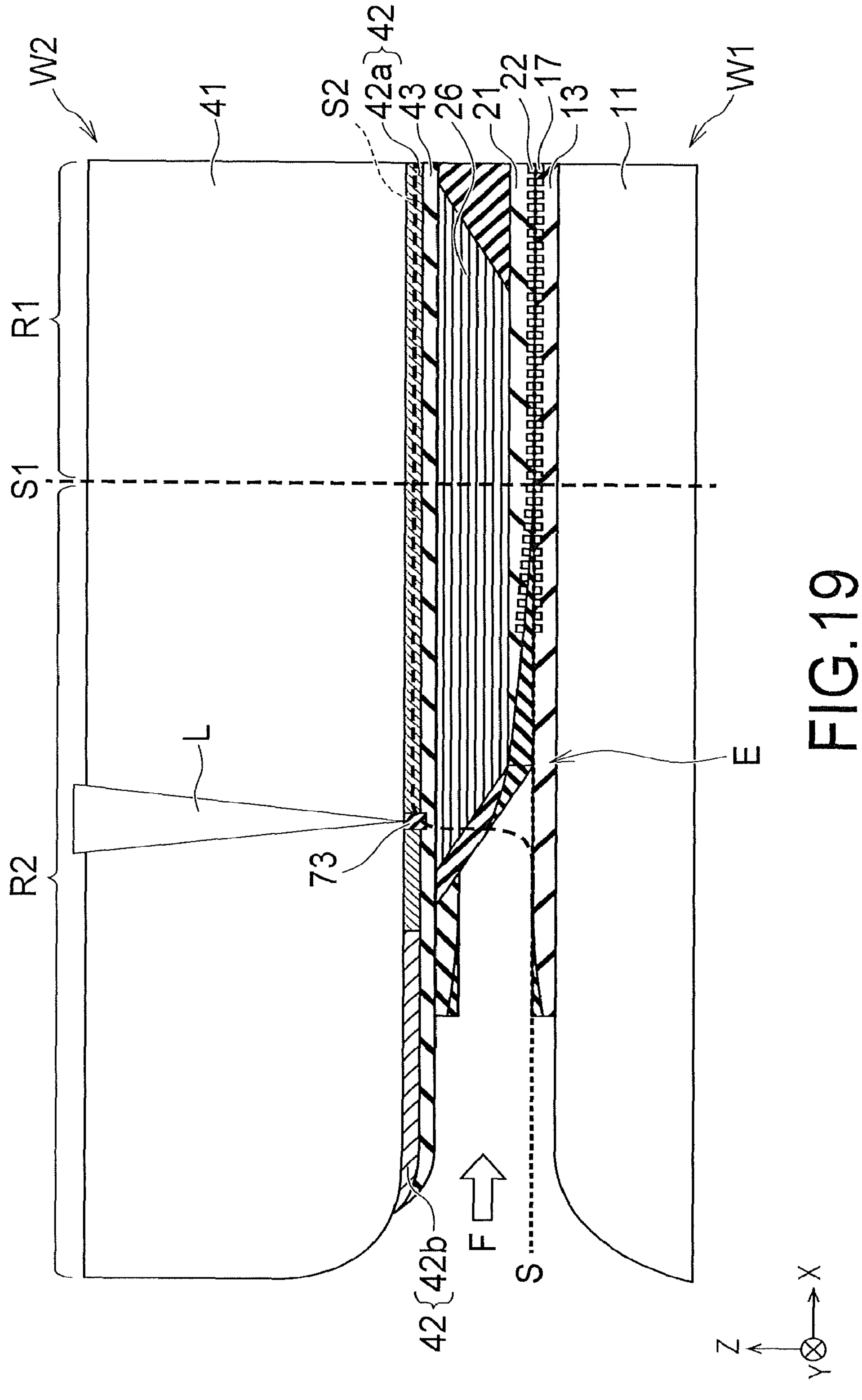
FIG. 19 is a cross-sectional view showing a method of manufacturing a semiconductor device of another modification of the second embodiment.

FIG. 19 is a cross-sectional view showing a method of manufacturing a semiconductor device of another modification of the second embodiment.

FIG. 19 shows the step shown in FIG. 7B, that is, the step of applying the physical force "F" to the array wafer W2. The structure shown in FIG. 19 is substantially the same as the structure shown in FIG. 16. However, the array wafer W2 shown in FIG. 19 includes a laser absorbing layer 73 instead of the air gap 72. The laser absorbing layer 73 is formed in the array wafer W2 before bonding the circuit wafer W1 and the array wafer W2. The laser absorbing layer 73 is an example of a second layer.

The laser absorbing layer 73 shown in FIG. 19 is formed in the semiconductor layer 42*a* and the cap insulator 43 in the region R2, and in more detail, extends through the semiconductor layer 42*a* but does not extend through the cap insulator 43. When the laser absorbing layer 73 is irradiated with laser L, the laser absorbing layer 73 absorbs the laser L. The laser absorbing layer 73 having been irradiated with the laser L generates heat (ablation). This heat causes stress to be applied to the semiconductor layer 42*a*. As a result, when the substrate 11 and the substrate 41 are separated along the separation face S2, the separation face S2 easily passes through the air gap 72 as shown in FIG. 19.

Therefore, when applying the force "F" to the array wafer W2 shown in FIG. 19, the laser absorbing layer 73 is irradiated with the laser L in advance as shown in FIG. 19. The laser absorbing layer 73 is irradiated with the laser L through the substrate 41 from the rear face side of the substrate 41. Therefore, the wavelength of the laser L is set at a value that enables transmission through the substrate 41. The laser absorbing layer 73 is a $SiO_2$ film or a SiN film, for example. The laser L is $CO_2$ laser, for example.

The present modification makes it possible to form the separation face S2 that passes through the laser absorbing layer 73 and to form the separation face S2 in the semiconductor layer 42*a* in the region R2 by forming the laser absorbing layer 73 in the semiconductor layer 42*a* in the region R2. This makes it possible to prevent the separation face S2 from being formed in the stacked film 26 in the region R1.

Figure 20B:
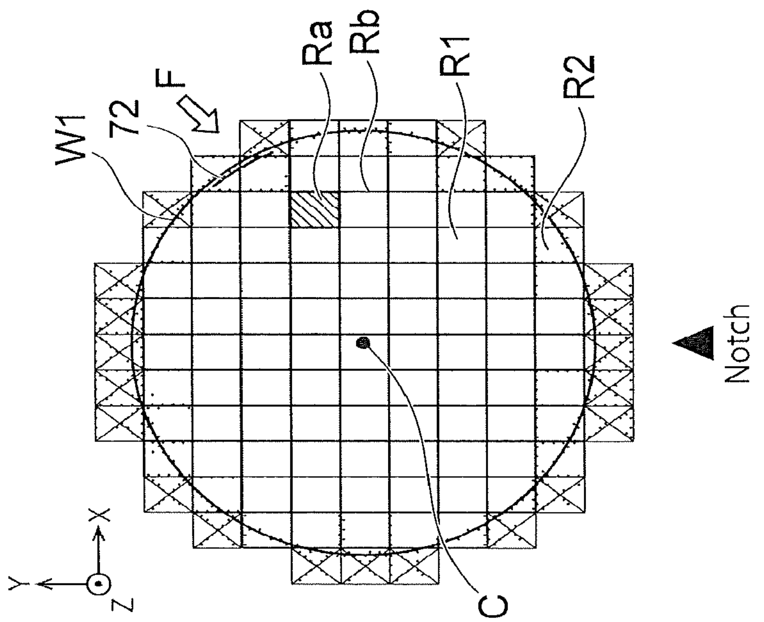
FIGS. 20A and 20B are plan views showing a method of manufacturing the semiconductor device of the second embodiment.
Figure 20A:
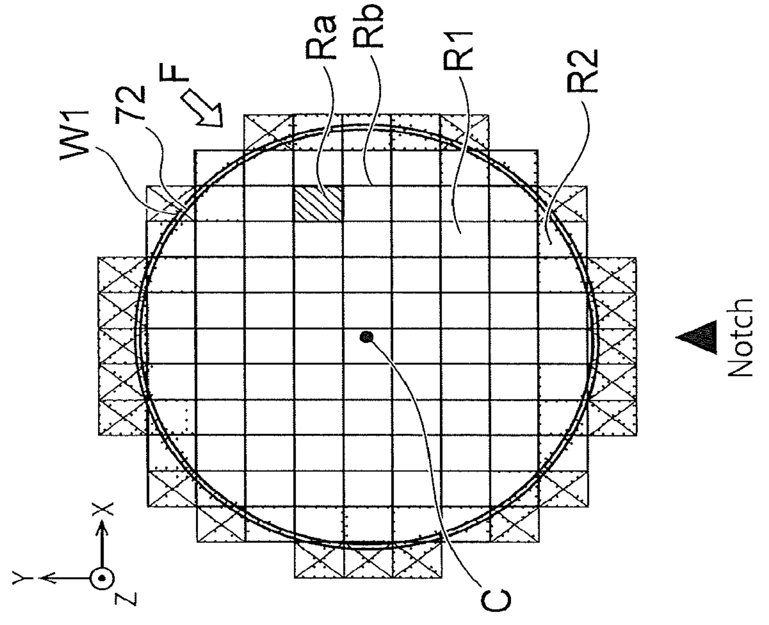

FIGS. 20A and 20B are plan views showing the method of manufacturing the semiconductor device of the second embodiment.

FIG. 20A corresponds to FIG. 14A described above. However, FIG. 20A shows the annular air gap 72 instead of the annular crack stopper layer 71. In FIG. 20A, the air gap 72 is formed in the region R2 in a manner annularly surrounding the region R1. This makes it possible to effectively prevent a crack from being produced in the stacked film 26 in the region R1 by virtue of the air gap 72.

The air gap 72 may have a shape shown in FIG. 20B instead of the shape shown in FIG. 20A. The air gap 72 shown in FIG. 20B has a non-annular shape in plan view, and to be specific, is formed only in the vicinity of the position to which the force "F" is to be applied. A crack into the stacked film 26 in the region R1 is likely to be produced in the vicinity of the position to which the force "F" is to be applied. Therefore, the air gap 72 having the shape shown in FIG. 20B also makes it possible to effectively prevent a crack from being produced in the stacked film 26 in the region R1.

The laser absorbing layer 73 may be provided at the position of the air gap 72 shown in FIGS. 20A and 20B instead of the air gap 72.

Figure 21A:
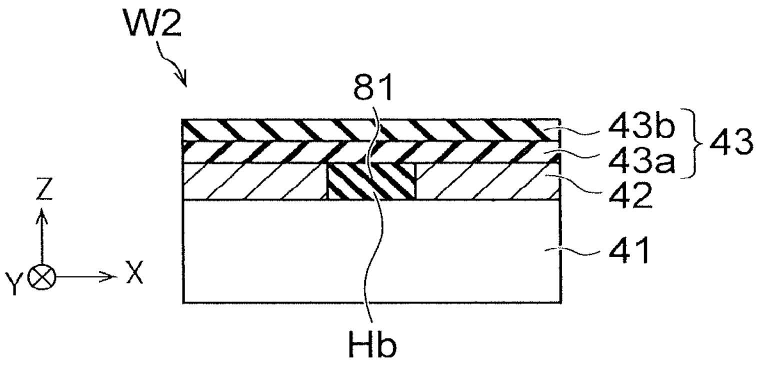
FIGS. 21A and 21B are cross-sectional views showing details of the method of manufacturing the semiconductor device of the second embodiment.
Figure 21B:
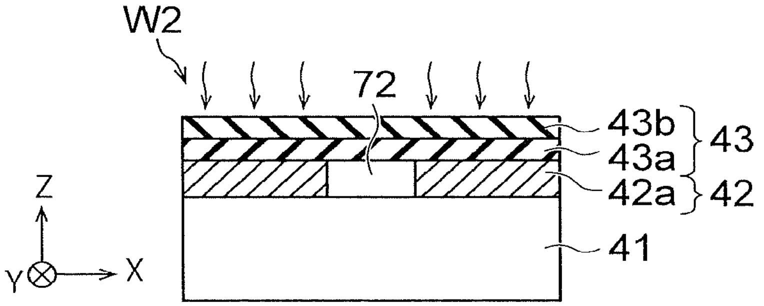

FIGS. 21A and 21B are cross-sectional views showing details of the method of manufacturing the semiconductor device of the second embodiment.

FIG. 21A shows the array wafer W2 shown in FIG. 3B. However, in FIG. 21A, an opening Hb is formed in the semiconductor layer 42 before forming the cap insulator 43 on the semiconductor layer 42, and a sacrificial layer 81 is formed in the opening Hb. The sacrificial layer 81 is a resist film that can be removed by laser annealing, for example.

FIG. 21B shows laser annealing shown in FIGS. 3C and 4A. However, in FIG. 21B, laser annealing not only causes the semiconductor layer 42 to turn into the semiconductor layer 42*a*, but also causes the sacrificial layer 81 to be removed. As a result, the air gap 72 is formed in the semiconductor layer 42*a*. Thereafter, the array wafer W2 is bonded to the circuit wafer W1 after the steps shown in FIGS. 4B and 4C.

When forming the air gap 72 shown in FIG. 20A, the opening Hb having an annular shape is formed. On the other hand, when forming the air gap 72 shown in FIG. 20B, the opening Hb having a non-annular shape is formed.

The air gap 72 formed by the present method may have the shape shown in FIG. 17 or FIG. 18 instead of having the shape shown in FIG. 16. The sacrificial layer 81 may be other than the resist film, and may be a NSG (Non-doped Silicate Glass) film, for example. The air gap 72 may be formed by a method similar to the method of forming the cavities H2 shown in FIG. 5B.

Figure 22A:
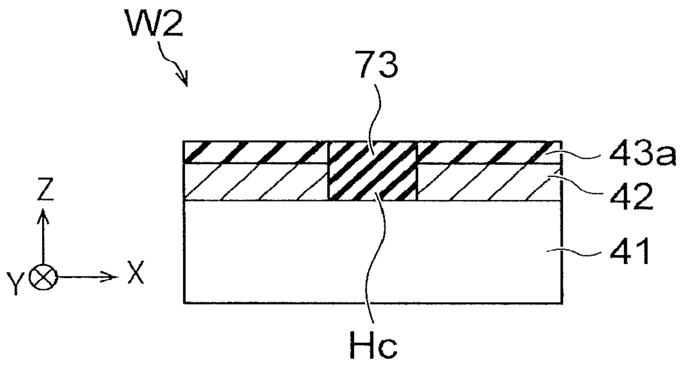
FIGS. 22A and 22B are cross-sectional views showing details of a method of manufacturing a semiconductor device of a modification of the second embodiment.
Figure 22B:
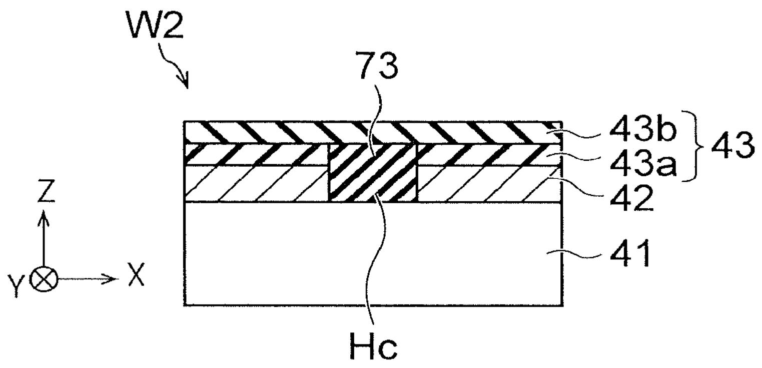

FIGS. 22A and 22B are cross-sectional views showing details of a method of manufacturing a semiconductor device of a modification of the second embodiment.

FIG. 22A shows the array wafer W2 shown in FIG. 3B. However, in FIG. 22A, an opening Hc is formed in the semiconductor layer 42 and the insulator 43*a* before forming the insulator 43*b* on the insulator 43*a*, and the laser absorbing layer 73 is formed in the opening Hc. The opening Hc may be formed in a manner extending through the insulator 43*a*, or may be formed in a manner not extending through the insulator 43*a*.

FIG. 22B also shows the array wafer W2 shown in FIG. 3B, but shows a step performed after the step shown in FIG. 22A. In FIG. 22B, the insulator 43*b* is formed on the insulator 43*a* after the laser absorbing layer 73 is formed. Thereafter, the array wafer W2 is bonded to the circuit wafer W1 after the steps shown in FIGS. 3C to 4C.

When forming the laser absorbing layer 73 similar to the air gap 72 shown in FIG. 20A, the opening Hc having an annular shape is formed. On the other hand, when forming the laser absorbing layer 73 similar to the air gap 72 shown in FIG. 20B, the opening Hc having a non-annular shape is formed.

The semiconductor layer 42*a* (porous layer) of the present embodiment is formed in the regions R1 and R2 similarly to the semiconductor layer 42*a* of the first embodiment. The present embodiment therefore makes it possible to suitably separate the substrate 11 and the substrate 41 after bonding by, for example, making it possible to prevent the separation face S2 from being formed in the stacked film 26 in the region R1. This makes it possible to reuse the substrate 41 separated from the substrate 11.

The substrate 11 and the substrate 41 of the present embodiment are separated in a state in which the air gap 72 or the laser absorbing layer 73 is provided in the region R2. The present embodiment therefore makes it possible to more suitably separate the substrate 11 and the substrate 41 after bonding by restricting the position at which the separation face S2 is to be formed.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:

forming a first film on a first substrate;

forming a porous layer in a first portion of the first film and a non-porous layer in a second portion of the first film, wherein the second portion is a portion different from the first portion, and is located in a direction along a surface of the first substrate relative to the first portion;

forming a second film including a first device on the first film;

forming a third film including a second device on a second substrate; and bonding the second film on the first substrate and the third film on the second substrate to be opposite to each other, wherein the semiconductor device includes a first region and a second region, the first region being located closer to a center of the first substrate than the second region, and the first device and the second device are located in the first region, the first portion is located among the first region and the second region, and the second portion is located only in the second region.

2. The method of claim 1, further comprising separating the first substrate and the second film after bonding the first substrate and the second substrate, wherein the separating produces a crack in the second region, and guides the crack into the porous layer.

3. The method of claim 1, wherein when seen in a direction vertical to a bonding face between the second film and the third film, an end of the first portion is located outside an end of the bonding face relative to a center of the semiconductor device.

4. The method of claim 1, wherein the first film includes a semiconductor layer formed on the first substrate, and a cap film formed on the semiconductor layer, and the porous layer and the non-porous layer are formed in the semiconductor layer.

5. The method of claim 1, wherein when seen in a direction vertical to a bonding face between the second film and the third film, the second region is located outside the first region.

6. The method of claim 5, wherein the first region is an effective chip region.

7. The method of claim 1, further comprising forming a first layer that extends across the first film and the second film located in the second region after forming the porous layer and before bonding the first substrate and the second substrate.

8. The method of claim 7, wherein when seen in a direction vertical to a bonding face between the second film and the third film, an end of the first portion is located outside the first layer relative to a center of the semiconductor device.

9. The method of claim 7, further comprising separating the first substrate and the second film after bonding the first substrate and the second substrate, wherein when seen in a direction vertical to a bonding face between the second film and the third film, the first layer has an annular shape, and the separating produces a crack in the second region, and then guides the crack into the porous layer at a position outside the first layer.

10. The method of claim 1, further comprising forming an air gap or a laser absorbing layer in the first film located in the second region after forming the porous layer and before bonding the first substrate and the second substrate.

11. The method of claim 1, wherein the first device and the second device are not located in the second region.

12. A semiconductor device comprising:

a first substrate;

a second substrate opposite to the first substrate;

a first film provided between the first substrate and the second substrate, and including a semiconductor layer;

a second film provided between the first film and the second substrate, and including a first device; and a third film provided between the second film and the second substrate, and including a second device, wherein the semiconductor layer includes a first portion including a porous layer, and a second portion including a non-porous layer, the second portion being a portion different from the first portion, and being located in a direction along a surface of the first substrate relative to the first portion, the semiconductor device includes a first region and a second region, the first region being located closer to a center of the first substrate than the second region, and the first device and the second device are located in the first region, the first portion is located among the first region and the second region, and the second portion is located only in the second region.

13. The device of claim 12, wherein the first substrate has a disc-like shape.

14. The device of claim 12, further comprising a first layer that extends across the first film and the second film located in the second region.

15. The device of claim 12, further comprising an air gap or a laser absorbing layer in the first film located in the second region.

16. The device of claim 12, wherein the second region is located on an outer circumference of the first region.

17. The device of claim 16, wherein the second region annularly surrounds the first region in plan view.

18. A method of manufacturing a semiconductor device, comprising:

preparing a semiconductor device including a first substrate, a second substrate opposite to the first substrate, a first film provided between the first substrate and the second substrate and including a semiconductor layer, a second film provided between the first film and the second substrate and including a first device, and a third film provided between the second film and the second substrate and including a second device, the semiconductor layer including a first portion including a porous layer, and a second portion including a non-porous layer, the second portion being a portion different from the first portion, and being located in a direction along a surface of the first substrate relative to the first portion, the semiconductor device including a first region and a second region, the first region being located closer to a center of the first substrate than the second region, the first device and the second device being located in the first region, the first portion being located among the first region and the second region, and the second portion being located only in the second region; and detaching the first substrate and the second substrate with an interposition of the semiconductor layer.

19. The method of claim 18, wherein the semiconductor device as prepared further includes a first layer that extends across the first film and the second film located in the second region.

20. The method of claim 18, wherein the semiconductor device as prepared further includes an air gap or a laser absorbing layer in the first film located in the second region.

* * * * *